(12) United States Patent
Tsang

(10) Patent No.: US 7,088,268 B2
(45) Date of Patent: Aug. 8, 2006

(54) DC FREE CODE DESIGN WITH STATE DEPENDENT MAPPING

(75) Inventor: Kinhing Paul Tsang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 91 days.

(21) Appl. No.: 10/978,676

(22) Filed: Nov. 1, 2004

(65) Prior Publication Data

US 2005/0151674 A1 Jul. 14, 2005

Related U.S. Application Data

(63) Continuation of application No. 10/395,495, filed on Mar. 24, 2003, now Pat. No. 6,867,713.

(60) Provisional application No. 60/409,156, filed on Sep. 9, 2002.

(51) Int. Cl.
*H03M 5/00* (2006.01)
(52) U.S. Cl. .......................................... 341/58; 341/59
(58) Field of Classification Search ................. 341/58, 341/59, 50, 67, 65
See application file for complete search history.

(56) References Cited

U.S. PATENT DOCUMENTS

| 4,675,652 A | 6/1987 | Machado | 341/59 |
| 4,715,036 A | 12/1987 | Oakes | 714/781 |
| 5,450,443 A | 9/1995 | Siegel | 375/286 |
| 5,608,397 A | 3/1997 | Soljanin | 341/58 |
| 5,901,158 A | 5/1999 | Weng | 714/785 |
| 5,960,041 A | 9/1999 | Calderbank | 714/785 |
| 6,154,504 A * | 11/2000 | Ino | 375/265 |
| 6,288,655 B1 * | 9/2001 | Tsang et al. | 341/59 |
| 6,295,010 B1 | 9/2001 | Thiesfeld | 341/58 |
| 6,353,912 B1 | 3/2002 | Uchida | 714/792 |
| 6,362,757 B1 | 3/2002 | Lee | 341/102 |
| 6,501,396 B1 | 12/2002 | Kryzak et al. | 341/59 |
| 6,617,984 B1 | 9/2003 | Kryzak et al. | 341/59 |

OTHER PUBLICATIONS

Kees A. Schouhamer Immink and Levente Patrovics, "Performance Assessment of DC-Free Multimode Codes," IEEE Transactions On Communications, vol. 45 (No. 3), p. 7, (Mar. 3, 1997).
Volker Braun and Kees A. Schouhamer Immink, "An Enumerative Coding Technique For DC-Free Runlength Limited Sequences," IEEE Transactions on Communications, vol. 48 (No. 12), p. 8, (Dec. 12, 2000).
Kees A. Schouhamer Immink, "Spectral Codes," IEEE Transactions On Magnetics, vol. 23 (No. 2), p. 6, (Mar. 2, 1990).
Chang Ki Jeong and Eon Kyeong Joo, "Trellid Multilevel and Turbo Codes With DC Free Characteristics," IEICE Trans Fundamentals, vol. E83 (No. 12), p. 9 (Mar. 12, 2000).

* cited by examiner

*Primary Examiner*—Peguy JeanPierre
(74) *Attorney, Agent, or Firm*—Todd R. Fronek; Westman, Champlin & Kelly

(57) ABSTRACT

A codeword for use in a communication channel is provided. A first segment of the codeword includes a plurality of bits having a running digital sum (RDS) and a second segment includes a plurality of bits based on the RDS of the first segment.

19 Claims, 16 Drawing Sheets

US 7,088,268 B2

DC FREE CODE DESIGN WITH STATE DEPENDENT MAPPING

CROSS-REFERENCE TO RELATED APPLICATION

The present application is a continuation of and claims priority of U.S. patent application Ser. No. 10/395,495, filed Mar. 24, 2003, now U.S. Pat. No. 6,867,713 which claims the benefit of U.S. Provisional Application 60/409,156 filed on Sep. 9, 2002 for inventor Kinhing P. Tsang and entitled DC FREE CODE DESIGN WITH STATE DEPENDENT MAPPING, the contents of which are both hereby incorporated by reference in their entirety.

FIELD OF THE INVENTION

The present invention relates to communicating digital data through a communication channel. In particular, the present invention relates to encoding and decoding techniques for DC free codes.

BACKGROUND OF THE INVENTION

In the field of digital communications, digital information is typically prepared for transmission through a channel by encoding it. The encoded data is then used to modulate a transmission to the channel. A transmission received from the channel is then typically demodulated and decoded to recover the original information.

The encoding of the digital data serves to improve communication performance so that the transmitted signals are less corrupted by noise, fading, or other interference associated with the channel. The term "channel" can include media such as transmission lines, wireless communication and information storage devices such as magnetic disc drives: In the case of information storage devices, the signal is stored in the channel for a period of time before it is accessed or received. Encoding can reduce the probability of noise being introduced into a recovered digital signal when the encoding is adapted to the known characteristics of the data and its interaction with known noise characteristics of a communication channel.

In typical encoding arrangements, data words of m data bits are encoded into larger code words of n code bits, and the ratio m/n is known as the code rate of the encoding arrangement. Decreasing the code rate improves decoding and can also improve error correction, however, a decreased code rate also increases energy consumption and slows communication.

Further, it is often desirable for encoded channel sequences to have a spectral null at zero frequency. Such sequences are said to be DC free and particularly found to enhance the performance in perpendicular magnetic recording. Given a sequence of binary digits, wherein a binary digit "1" is plus one (+1) and a binary "0" is minus one (−1), the sequence will be DC free if a running digital sum of the sequence is bounded. The running digital sum is the sum of all values in a sequence. When the variation of the running digital sum is kept to a small value, it is known to have a tight or small bound. A tighter bound improves the performance of the channel.

There is a need to provide improved DC free coding techniques that reduce the probability of noise being introduced to the system and have optimal code rates. Various embodiments of the present invention address these problems, and offer other advantages over the prior art.

SUMMARY OF THE INVENTION

A codeword for use in a communication channel is provided. A first segment of the codeword includes a plurality of bits having a running digital sum (RDS) and a second segment includes a plurality of bits based on the RDS of the first segment.

Another embodiment includes a codeword representing an encoded data word for use in a system. The codeword includes a first segment representing a first fragment of the user data word and a second segment representing a second fragment of the user data word. The first segment and the second segment representing a state value for the system.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
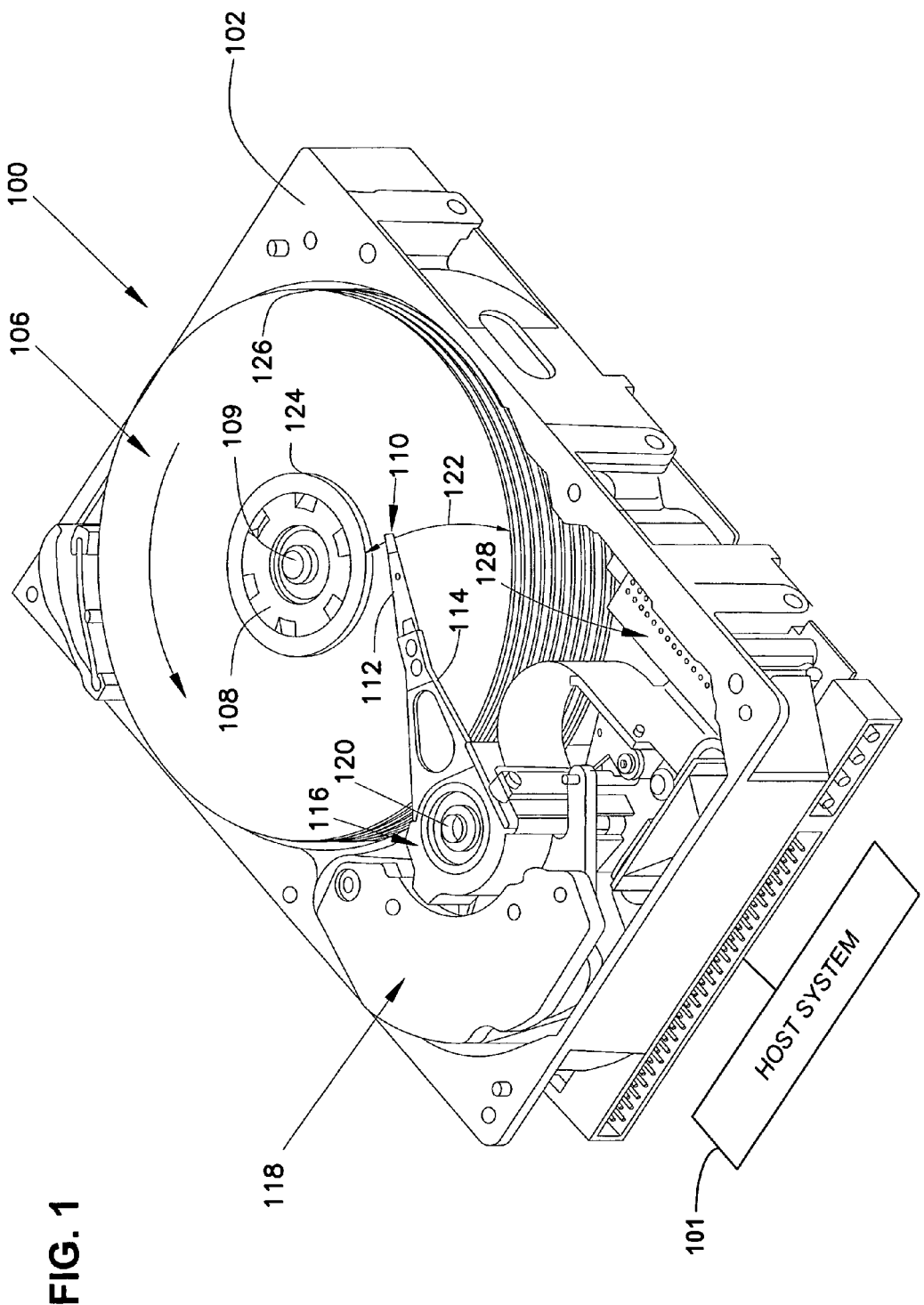
FIG. 1 is an isometric view of a disc drive.

FIG. 1 is a perspective view of a magnetic disc drive 100 in which the present invention is useful. Disc drive 100 communicates with a host system 101 and includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated head, which is mounted to disc drive 100 for communication with the disc surface. In the example shown in FIG. 1, heads 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate patch 122 between a disc inner diameter 124 and a disc outer diameter 126. Voice coil motor 118 operates under control of internal circuitry 128.

The heads 110 and rotating disc pack 106 form a communication channel that can receive digital data and reproduce the digital data at a later time. Write circuitry within internal circuitry 128 receives data, typically from a digital computer, and then encodes data in code words adapted to the communication channel. The encoded data is then used to modulate a write current provided to a write transducer in the head 110. The write transducer and the head 110 causes successive code words to be encoded on a magnetic layer on disc pack 106. At a later time, a read transducer in the head recovers the successive code words from the magnetic layer as a serial modulated read signal. Read circuitry within internal circuitry 128 demodulates the read signal into successive parallel code words. The demodulated code words are then decoded by decoder circuitry within circuitry 128, which recovers the digital data for use, by host system 101, at a later time.

In order to encode data that is written onto a magnetic layer on disc pack 106, a method according to the present invention is used. According to one embodiment of the present invention, a 19-bit word of user data is encoded into a 20-bit code word. In order to generate the 20-bit code word, the 19-bit data word is broken down into smaller fragments. The fragments are rearranged and mapped into two 10-bit segments according to a lookup table and a mapping table. In one embodiment, a goal of the method is to maintain the running digital sum of the system within a selected range of +/−4, calculated after each 20-bit code word. The selected range represents a bound on the running digital sum of the system. Maintaining the running sum within the selected range improves the performance of disc drive 100. Upon decoding of the code word, the code word is evaluated in order to determine a state value. Using the state value, the code word can be decoded using the state value to render the sequence of user bits.

Figure 2:
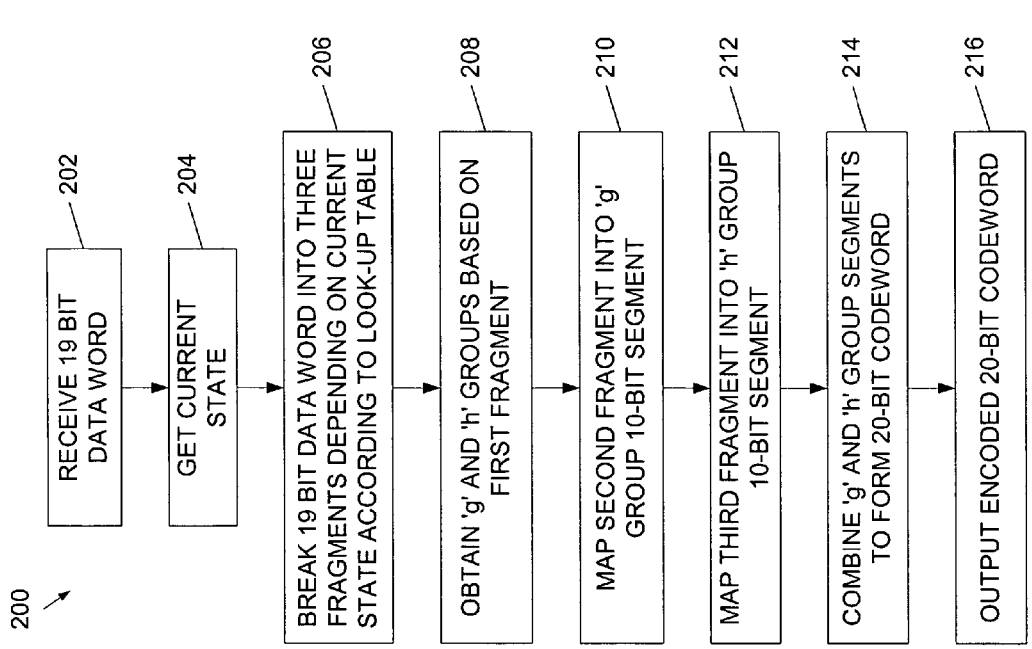
FIG. 2 is a flow diagram of a method of encoding information according to the present invention.

FIG. 2 illustrates a flow diagram of a method 200 of encoding information according to the present invention.

According to method 200, a 19-bit data word is received at step 202. At step 204, the method 200 accesses a current state value that has been calculated after each code word that is generated. The current state is the running digital sum of the system. The initial state is calculated as zero. Depending on the current state, the 19-bit data word is broken up into three fragments according to a lookup table at step 206. The assembly and format of the lookup table is discussed below. Next, at step 208, a 'g' group and an 'h' group is selected based on the first fragment as determined in step 206. These groups are chosen in order to maintain the running digital sum within a range of +/−4. Once the respective groups are obtained, the second fragment is mapped into a 'g' group 10-bit segment at step 210. The mapping is performed according to a mapping table as discussed below. In step 212, the third fragment is mapped into an 'h' group 10-bit segment according to a mapping table. The 'g' group and 'h' group segments are then combined, at step 214, to form a 20-bit code word that maintains the running digital sum of the system within +/−4. The code word is output, for example to a disc, at step 216.

In order to generate the lookup table, it is important to investigate the running digital sums for 20-bit code words. By separating 20-bit code words into 10-bit segments, the design of a rate 19/20 DC free code is simplified. For a given a 10 bit pattern, the pattern may have a running digital sum of −10, −8, −6, −4, −2, −0, 2, 4, 6, 8 or 10. Table 1 shows 10 bit patterns grouped according to their respective digital sums. The groups having running digital sums of 0, 2, 4, 6 and 8 are shown. Since the running digital sums of −2, −4, −6 and −8 are merely the inverse of the corresponding patterns with the positive running digital sum, only the groups with a positive running digital sum are shown. The patterns having running digital sums of 10 and −10 are not used. The table shows the 10-bit patterns in hexadecimal.

TABLE 1

A Grouping Table that groups 10-bit segments according to their respective running digital sums.

Group gb:
There are 252 10-bit patterns with RDS = 0

| 01F | 02F | 037 | 03B | 03D | 03E | 04F | 057 | 05B | 05D | 05E | 067 | 06B | 06D | 06E | 073 |
| 075 | 076 | 079 | 07A | 07C | 08F | 097 | 09B | 09D | 09E | 0A7 | 0AB | 0AD | 0AE | 0B3 | 0B5 |
| 0B6 | 0B9 | 0BA | 0BC | 0C7 | 0CB | 0CD | 0CE | 0D3 | 0D5 | 0D6 | 0D9 | 0DA | 0DC | 0E3 | 0E5 |
| 0E6 | 0E9 | 0EA | 0EC | 0F1 | 0F2 | 0F4 | 0F8 | 10F | 117 | 11B | 11D | 11E | 127 | 12B | 12D |
| 12E | 133 | 135 | 136 | 139 | 13A | 13C | 147 | 14B | 14D | 14E | 153 | 155 | 156 | 159 | 15A |
| 15C | 163 | 165 | 166 | 169 | 16A | 16C | 171 | 172 | 174 | 178 | 187 | 18B | 18D | 18E | 193 |
| 195 | 196 | 199 | 19A | 19C | 1A3 | 1A5 | 1A6 | 1A9 | 1AA | 1AC | 1B1 | 1B2 | 1B4 | 1B8 | 1C3 |
| 1C5 | 1C6 | 1C9 | 1CA | 1CC | 1D1 | 1D2 | 1D4 | 1D8 | 1E1 | 1E2 | 1E4 | 1E8 | 1F0 | 20F | 217 |
| 21B | 21D | 21E | 227 | 22B | 22D | 22E | 233 | 235 | 236 | 239 | 23A | 23C | 247 | 24B | 24D |
| 24E | 253 | 255 | 256 | 259 | 25A | 25C | 263 | 265 | 266 | 269 | 26A | 26C | 271 | 272 | 274 |
| 278 | 287 | 28B | 28D | 28E | 293 | 295 | 296 | 299 | 29A | 29C | 2A3 | 2A5 | 2A6 | 2A9 | 2AA |
| 2AC | 2B1 | 2B2 | 2B4 | 2B8 | 2C3 | 2C5 | 2C6 | 2C9 | 2CA | 2CC | 2D1 | 2D2 | 2D4 | 2D8 | 2E1 |
| 2E2 | 2E4 | 2E8 | 2F0 | 307 | 30B | 30D | 30E | 313 | 315 | 316 | 319 | 31A | 31C | 323 | 325 |
| 326 | 329 | 32A | 32C | 331 | 332 | 334 | 338 | 343 | 345 | 346 | 349 | 34A | 34C | 351 | 352 |
| 354 | 358 | 361 | 362 | 364 | 368 | 370 | 383 | 385 | 386 | 389 | 38A | 38C | 391 | 392 | 394 |
| 398 | 3A1 | 3A2 | 3A4 | 3A8 | 3B0 | 3C1 | 3C2 | 3C4 | 3C8 | 3D0 | 3E0 | | | | |

Group gc:
There are 210 10-bit patterns with RDS = +2

| 03F | 05F | 06F | 077 | 07B | 07D | 07E | 09F | 0AF | 0B7 | 0BB | 0BD | 0BE | 0CF | 0D7 | 0DB |
| 0DD | 0DE | 0E7 | 0EB | 0ED | 0EE | 0F3 | 0F5 | 0F6 | 0F9 | 0FA | 0FC | 11F | 12F | 137 | 13B |
| 13D | 13E | 14F | 157 | 15B | 15D | 15E | 167 | 16B | 16D | 16E | 173 | 175 | 176 | 179 | 17A |
| 17C | 18F | 197 | 19B | 19D | 19E | 1A7 | 1AB | 1AD | 1AE | 1B3 | 1B5 | 1B6 | 1B9 | 1BA | 1BC |
| 1C7 | 1CB | 1CD | 1CE | 1D3 | 1D5 | 1D6 | 1D9 | 1DA | 1DC | 1E3 | 1E5 | 1E6 | 1E9 | 1EA | 1EC |
| 1F1 | 1F2 | 1F4 | 1F8 | 21F | 22F | 237 | 23B | 23D | 23E | 24F | 257 | 25B | 25D | 25E | 267 |
| 26B | 26D | 26E | 273 | 275 | 276 | 279 | 27A | 27C | 28F | 297 | 29B | 29D | 29E | 2A7 | 2AB |

TABLE 1-continued

A Grouping Table that groups 10-bit segments according to their respective running digital sums.

| 2AD | 2AE | 2B3 | 2B5 | 2B6 | 2B9 | 2BA | 2BC | 2C7 | 2CB | 2CD | 2CE | 2D3 | 2D5 | 2D6 | 2D9 |
|-----|-----|-----|-----|-----|-----|-----|-----|-----|-----|-----|-----|-----|-----|-----|-----|
| 2DA | 2DC | 2E3 | 2E5 | 2E6 | 2E9 | 2EA | 2EC | 2F1 | 2F2 | 2F4 | 2F8 | 30F | 317 | 31B | 31D |
| 31E | 327 | 32B | 32D | 32E | 333 | 335 | 336 | 339 | 33A | 33C | 347 | 34B | 34D | 34E | 353 |
| 355 | 356 | 359 | 35A | 35C | 363 | 365 | 366 | 369 | 36A | 36C | 371 | 372 | 374 | 378 | 387 |
| 38B | 38D | 38E | 393 | 395 | 396 | 399 | 39A | 39C | 3A3 | 3A5 | 3A6 | 3A9 | 3AA | 3AC | 3B1 |
| 3B2 | 3B4 | 3B8 | 3C3 | 3C5 | 3C6 | 3C9 | 3CA | 3CC | 3D1 | 3D2 | 3D4 | 3D8 | 3E1 | 3E2 | 3E4 |
| 3E8 | 3F0 |     |     |     |     |     |     |     |     |     |     |     |     |     |     |

Group gd:
There are 120 10-bit patterns with RDS = +4

| 07F | 0BF | 0DF | 0EF | 0F7 | 0FB | 0FD | 0FE | 13F | 15F | 16F | 177 | 17B | 17D | 17E | 19F |
|-----|-----|-----|-----|-----|-----|-----|-----|-----|-----|-----|-----|-----|-----|-----|-----|
| 1AF | 1B7 | 1BB | 1BD | 1BE | 1CF | 1D7 | 1DB | 1DD | 1DE | 1E7 | 1EB | 1ED | 1EE | 1F3 | 1F5 |
| 1F6 | 1F9 | 1FA | 1FC | 23F | 25F | 26F | 277 | 27B | 27D | 27E | 2AF | 2B7 | 2BB | 2BD |
| 2BE | 2CF | 2D7 | 2DB | 2DD | 2DE | 2E7 | 2EB | 2ED | 2EE | 2F3 | 2F5 | 2F6 | 2F9 | 2FA | 2FC |
| 31F | 32F | 337 | 33B | 33D | 33E | 34F | 357 | 35B | 35D | 35E | 367 | 36B | 36D | 36E | 373 |
| 375 | 376 | 379 | 37A | 37C | 38F | 397 | 39B | 39D | 39E | 3A7 | 3AB | 3AD | 3AE | 3B3 | 3B5 |
| 3B6 | 3B9 | 3BA | 3BC | 3C7 | 3CB | 3CD | 3CE | 3D3 | 3D5 | 3D6 | 3D9 | 3DA | 3DC | 3E3 | 3E5 |
| 3E6 | 3E9 | 3EA | 3EC | 3F1 | 3F2 | 3F4 | 3F8 |     |     |     |     |     |     |     |     |

Group ge:
There are 45 10-bit patterns with RDS = +6

| 0FF | 17F | 1BF | 1DF | 1EF | 1F7 | 1FB | 1FD | 1FE | 27F | 2BF | 2DF | 2EF | 2F7 | 2FB | 2FD |
|-----|-----|-----|-----|-----|-----|-----|-----|-----|-----|-----|-----|-----|-----|-----|-----|
| 2FE | 33F | 35F | 36F | 377 | 37B | 37D | 37E | 39F | 3AF | 3B7 | 3BB | 3BD | 3BE | 3CF | 3D7 |
| 3DB | 3DD | 3DE | 3E7 | 3EB | 3ED | 3EE | 3F3 | 3F5 | 3F6 | 3F9 | 3FA | 3FC |     |     |     |

Group gf:
There are 10 10-bit patterns with RDS = +8

| 1FF | 2FF | 37F | 3BF | 3DF | 3EF | 3F7 | 3FB | 3FD | 3FE |
|-----|-----|-----|-----|-----|-----|-----|-----|-----|-----|

Each of the groups in Table 1 is further divided into subgroups of various sizes. The various subgroups map bits of user fragments determined in step 206, depending on the size of the user data, into a 10-bit code word. For example, a user data fragment of 7 bits is mapped into a 7-bit subgroup, for example subgroup gb7. This group will be utilized when the first fragment has a length of 7 bits. Group gb is divided into subgroups gb7, gb6, gb5 gb4 gb3 and gb2 with sizes of $128=2^7$, $64=2^6$, $32=2^5$, $16=2^4$, $8=2^3$ and $4=2^2$ respectively. Group gc is divided into subgroups gc7, gc6, gc4 and gc1 with sizes of $128=2^7$, $64=2^6$, $16=2^4$ and $2=2^1$ respectively. Group gd is divided into subgroups gd6, gd5, gd4 and gd3 with sizes of $64=2^6$, $32=2^5$, $16=2^4$ and $8=2^3$ respectively. Group ge is divided into subgroups ge5 and ge3 with sizes of $32=2^5$ and $8=2^3$ respectively. Group gf is divided into subgroups gf3 and gf1 with sizes of $8=2^3$ and $2=2^1$ respectively. The size of each subgroup is of a size $2^m$, which allows mapping of user data fragments of size m bits. Table 2 shows each of the various subgroups. In the table, the mapping is shown in the form "xxx:yyy", wherein "xxx" is a user data fragment that is mapped into a 10-bit code word "yyy". The values in the table are expressed in hexadecimal.

TABLE 2

Mapping Table of user fragments into 'g' group words.

Subgroup gb7: (mapping of 7-bit data word into 10-bit code word)

| 000:21B | 001:233 | 002:235 | 003:236 | 004:22B | 005:239 | 006:23A | 007:23C |
|---------|---------|---------|---------|---------|---------|---------|---------|
| 008:24B | 009:253 | 00A:255 | 00B:256 | 00C:28B | 00D:259 | 00E:25A | 00F:25C |
| 010:21D | 011:263 | 012:265 | 013:266 | 014:22D | 015:269 | 016:26A | 017:26C |
| 018:24D | 019:293 | 01A:295 | 01B:296 | 01C:28D | 01D:299 | 01E:29A | 01F:29C |
| 020:21E | 021:2A3 | 022:2A5 | 023:2A6 | 024:22E | 025:2A9 | 026:2AA | 027:2AC |
| 028:24E | 029:2C3 | 02A:2C5 | 02B:2C6 | 02C:28E | 02D:2C9 | 02E:2CA | 02F:2CC |
| 030:271 | 031:2B1 | 032:2D1 | 033:2E1 | 034:272 | 035:2B2 | 036:2D2 | 037:2E2 |
| 038:274 | 039:2B4 | 03A:2D4 | 03B:2E4 | 03C:278 | 03D:2B8 | 03E:2D8 | 03F:2E8 |
| 040:11B | 041:133 | 042:135 | 043:136 | 044:12B | 045:139 | 046:13A | 047:13C |
| 048:14B | 049:153 | 04A:155 | 04B:156 | 04C:18B | 04D:159 | 04E:15A | 04F:15C |
| 050:11D | 051:163 | 052:165 | 053:166 | 054:12D | 055:169 | 056:16A | 057:16C |
| 058:14D | 059:193 | 05A:195 | 05B:196 | 05C:18D | 05D:199 | 05E:19A | 05F:19C |
| 060:11E | 061:1A3 | 062:1A5 | 063:1A6 | 064:12E | 065:1A9 | 066:1AA | 067:1AC |
| 068:14E | 069:1C3 | 06A:1C5 | 06B:1C6 | 06C:18E | 06D:1C9 | 06E:1CA | 06F:1CC |
| 070:171 | 071:1B1 | 072:1D1 | 073:1E1 | 074:172 | 075:1B2 | 076:1D2 | 077:1E2 |
| 078:174 | 079:1B4 | 07A:1D4 | 07B:1E4 | 07C:178 | 07D:1B8 | 07E:1D8 | 07F:1E8 |

Subgroup gb6: (mapping of 6-bit data word into 10-bit code word)

| 000:331 | 001:313 | 002:315 | 003:316 | 004:332 | 005:319 | 006:31A | 007:31C |
|---------|---------|---------|---------|---------|---------|---------|---------|
| 008:334 | 009:323 | 00A:325 | 00B:326 | 00C:338 | 00D:329 | 00E:32A | 00F:32C |
| 010:3C1 | 011:343 | 012:345 | 013:346 | 014:3C2 | 015:349 | 016:34A | 017:34C |
| 018:3C4 | 019:383 | 01A:385 | 01B:386 | 01C:3C8 | 01D:389 | 01E:38A | 01F:38C |

TABLE 2-continued

Mapping Table of user fragments into 'g' group words.

| 020:0CE | 021:0EC | 022:0EA | 023:0E9 | 024:0CD | 025:0E6 | 026:0E5 | 027:0E3 |
| 028:0CB | 029:0DC | 02A:0DA | 02B:0D9 | 02C:0C7 | 02D:0D6 | 02E:0D5 | 02F:0D3 |
| 030:03E | 031:0BC | 032:0BA | 033:0B9 | 034:03D | 035:0B6 | 036:0B5 | 037:0B3 |
| 038:03B | 039:07C | 03A:07A | 03B:079 | 03C:037 | 03D:076 | 03E:075 | 03F:073 |

Subgroup gb5: (mapping of 5-bit data word into 10-bit code word)

| 000:351 | 001:352 | 002:354 | 003:358 | 004:361 | 005:362 | 006:364 | 007:368 |
| 008:391 | 009:392 | 00A:394 | 00B:398 | 00C:3A1 | 00D:3A2 | 00E:3A4 | 00F:3A8 |
| 010:0AE | 011:0AD | 012:0AB | 013:0A7 | 014:09E | 015:09D | 016:09B | 017:097 |
| 018:06E | 019:06D | 01A:06B | 01B:067 | 01C:05E | 01D:05D | 01E:05B | 01F:057 |

Subgroup gb4: (mapping of 4-bit data word into 10-bit code word)

| 000:307 | 001:30B | 002:30D | 003:30E | 004:370 | 005:3B0 | 006:3D0 | 007:3E0 |
| 008:0F8 | 009:0F4 | 00A:0F2 | 00B:0F1 | 00C:08F | 00D:04F | 00E:02F | 00F:01F |

Subgroup gb3: (mapping of 3-bit data word into 10-bit code word)

| 000:117 | 001:127 | 002:147 | 003:187 | 004:217 | 005:227 | 006:247 | 007:287 |

Subgroup gb2: (mapping of 2-bit data word into 10-bit code word)

| 000:10F | 001:20F | 002:1F0 | 003:2F0 | | | | |

Subgroup gc7: (mapping of 7-bit data word into 10-bit code word)

| 000:257 | 001:25B | 002:25D | 003:25E | 004:267 | 005:26B | 006:26D | 007:26E |
| 008:297 | 009:29B | 00A:29D | 00B:29E | 00C:2A7 | 00D:2AB | 00E:2AD | 00F:2AE |
| 010:237 | 011:23B | 012:23D | 013:23E | 014:2C7 | 015:2CB | 016:2CD | 017:2CE |
| 018:273 | 019:2B3 | 01A:2D3 | 01B:2E3 | 01C:27C | 01D:2BC | 01E:2DC | 01F:2EC |
| 020:275 | 021:2B5 | 022:2D5 | 023:2E5 | 024:276 | 025:2B6 | 026:2D6 | 027:2E6 |
| 028:279 | 029:2B9 | 02A:2D9 | 02B:2E9 | 02C:27A | 02D:2BA | 02E:2DA | 02F:2EA |
| 030:21F | 031:22F | 032:24F | 033:28F | 034:2F1 | 035:2F2 | 036:2F4 | 037:2F8 |
| 038:077 | 039:0B7 | 03A:0D7 | 03B:0E7 | 03C:07B | 03D:0BB | 03E:0DB | 03F:0EB |
| 040:157 | 041:15B | 042:15D | 043:15E | 044:167 | 045:16B | 046:16D | 047:16E |
| 048:197 | 049:19B | 04A:19D | 04B:19E | 04C:1A7 | 04D:1AB | 04E:1AD | 04F:1AE |
| 050:137 | 051:13B | 052:13D | 053:13E | 054:1C7 | 055:1CB | 056:1CD | 057:1CE |
| 058:173 | 059:1B3 | 05A:1D3 | 05B:1E3 | 05C:17C | 05D:1BC | 05E:1DC | 05F:1EC |
| 060:175 | 061:1B5 | 062:1D5 | 063:1E5 | 064:176 | 065:1B6 | 066:1D6 | 067:1E6 |
| 068:179 | 069:1B9 | 06A:1D9 | 06B:1E9 | 06C:17A | 06D:1BA | 06E:1DA | 06F:1EA |
| 070:11F | 071:12F | 072:14F | 073:18F | 074:1F1 | 075:1F2 | 076:1F4 | 077:1F8 |
| 078:07D | 079:0BD | 07A:0DD | 07B:0ED | 07C:07E | 07D:0BE | 07E:0DE | 07F:0EE |

Subgroup gc6: (mapping of 6-bit data word into 10-bit code word)

| 000:31B | 001:333 | 002:335 | 003:336 | 004:32B | 005:339 | 006:33A | 007:33C |
| 008:34B | 009:353 | 00A:355 | 00B:356 | 00C:38B | 00D:359 | 00E:35A | 00F:35C |
| 010:31D | 011:363 | 012:365 | 013:366 | 014:32D | 015:369 | 016:36A | 017:36C |
| 018:34D | 019:393 | 01A:395 | 01B:396 | 01C:38D | 01D:399 | 01E:39A | 01F:39C |
| 020:31E | 021:3A3 | 022:3A5 | 023:3A6 | 024:32E | 025:3A9 | 026:3AA | 027:3AC |
| 028:34E | 029:3C3 | 02A:3C5 | 02B:3C6 | 02C:38E | 02D:3C9 | 02E:3CA | 02F:3CC |
| 030:371 | 031:3B1 | 032:3D1 | 033:3E1 | 034:372 | 035:3B2 | 036:3D2 | 037:3E2 |
| 038:374 | 039:3B4 | 03A:3D4 | 03B:3E4 | 03C:378 | 03D:3B8 | 03E:3D8 | 03F:3E8 |

Subgroup gc4: (mapping of 4-bit data word into 10-bit code word)

| 000:317 | 001:03F | 002:05F | 003:06F | 004:327 | 005:09F | 006:0AF | 007:0CF |
| 008:347 | 009:0F3 | 00A:0F5 | 00B:0F6 | 00C:387 | 00D:0F9 | 00E:0FA | 00F:0FC |

Subgroup gc1: (mapping of 1-bit data word into 10-bit code word)

| 000:30F | 001:3F0 | | | | | | |

Subgroup gd6: (mapping of 6-bit data word into 10-bit code word)

| 000:357 | 001:35B | 002:35D | 003:35E | 004:367 | 005:36B | 006:36D | 007:36E |
| 008:397 | 009:39B | 00A:39D | 00B:39E | 00C:3A7 | 00D:3AB | 00E:3AD | 00F:3AE |
| 010:337 | 011:33B | 012:33D | 013:33E | 014:3C7 | 015:3CB | 016:3CD | 017:3CE |
| 018:373 | 019:3B3 | 01A:3D3 | 01B:3E3 | 01C:37C | 01D:3BC | 01E:3DC | 01F:3EC |
| 020:375 | 021:3B5 | 022:3D5 | 023:3E5 | 024:376 | 025:3B6 | 026:3D6 | 027:3E6 |
| 028:379 | 029:3B9 | 02A:3D9 | 02B:3E9 | 02C:37A | 02D:3BA | 02E:3DA | 02F:3EA |
| 030:31F | 031:32F | 032:34F | 033:38F | 034:3F1 | 035:3F2 | 036:3F4 | 037:3F8 |
| 038:07F | 039:0BF | 03A:0DF | 03B:0EF | 03C:0F7 | 03D:0FB | 03E:0FD | 03F:0FE |

Subgroup gd5: (mapping of 5-bit data word into 10-bit code word)

| 000:277 | 001:2B7 | 002:2D7 | 003:2E7 | 004:27B | 005:2BB | 006:2DB | 007:2EB |
| 008:27D | 009:2BD | 00A:2DD | 00B:2ED | 00C:27E | 00D:2BE | 00E:2DE | 00F:2EE |
| 010:177 | 011:1B7 | 012:1D7 | 013:1E7 | 014:17B | 015:1BB | 016:1DB | 017:1EB |
| 018:17D | 019:1BD | 01A:1DD | 01B:1ED | 01C:17E | 01D:1BE | 01E:1DE | 01F:1EE |

Subgroup gd4: (mapping of 4-bit data word into 10-bit code word)

| 000:15F | 001:16F | 002:19F | 003:1AF | 004:25F | 005:26F | 006:29F | 007:2AF |
| 008:1F5 | 009:1F6 | 00A:1F9 | 00B:1FA | 00C:2F5 | 00D:2F6 | 00E:2F9 | 00F:2FA |

TABLE 2-continued

Mapping Table of user fragments into 'g' group words.

Subgroup gd3: (mapping of 3-bit data word into 10-bit code word)

| 000:13F | 001:1CF | 002:23F | 003:2CF | 004:1F3 | 005:1FC | 006:2F3 | 007:2FC |

Subgroup ge5: (mapping of 5-bit data word into 10-bit code word)

| 000:377 | 001:37B | 002:37D | 003:37E | 004:3B7 | 005:3BB | 006:3BD | 007:3BE |
| 008:3D7 | 009:3DB | 00A:3DD | 00B:3DE | 00C:3E7 | 00D:3EB | 00E:3ED | 00F:3EE |
| 010:17F | 011:1BF | 012:1DF | 013:1EF | 014:27F | 015:2BF | 016:2DF | 017:2EF |
| 018:1F7 | 019:1FB | 01A:1FD | 01B:1FE | 01C:2F7 | 01D:2FB | 01E:2FD | 01F:2FE |

Subgroup ge3: (mapping of 3-bit data word into 10-bit code word)

| 000:35F | 001:36F | 002:39F | 003:3AF | 004:3F5 | 005:3F6 | 006:3F9 | 007:3FA |

Subgroup gf3: (mapping of 3-bit data word into 10-bit code word)

| 000:37F | 001:3BF | 002:3DF | 003:3EF | 004:3F7 | 005:3FB | 006:3FD | 007:3FE |

The third fragment is then mapped into an 'h' group word to maintain the running digital sum within +/−4. This mapping takes into account the current running digital sum of the system and the running digital sum of the 'g' group segment. The selection of the 'h' group code can be separated into three cases, depending on the current running digital sum of the system. The first case is if the current RDS is −4, the second case is if the RDS is −2 and the third case is if the RDS is 0. The cases of RDS being +4 or +2 are just the inverse of −4 and −2. Although there are different ways to group the 'h' groups, table 3 shows groupings according to various running digital sums. The 'h' groups can be chosen that correspond to collections from the 'g' subgroups. In some instances, the inverse, or −gxx, of the subgroup is chosen. Also, there are situations where the 'h' group word is larger (has more bits) than the corresponding mapping 'g' group (i.e. a fragment from the group ha8 is mapped to the group gc6). Here, the least significant bits of the third fragment are chosen to map the 'h' group according to the corresponding 'g' group.

TABLE 3

Mapping Table of user fragments into 'h' group words.

Subgroup ha8 includes 256 patterns and they are from gc7, gc6 and gd6. Since $2^8$ = 256, these code words are exactly enough for the encoding of 8-bit data words. Mappings of 8-bit data word to these 10-bit code words of subgroup ha8 are:

| Data | 000 to 07F | : | gc7(128 patterns, RDS = +2) |
| Data | 080 to 0BF | : | gc6(64 patterns, RDS = +2) |
| Data | 0C0 to 0FF | : | gd6(64 patterns, RDS = +4) |

Subgroup ha6 includes 64 patterns and they are from gd5 and ge5. Mappings of 6-bit data word to these 10-bit code words are:

| Data | 000 to 01F | : | gd5(32 patterns, RDS = +4) |
| Data | 020 to 03F | : | ge5(32 patterns, RDS = +6) |

Subgroup ha5 includes 32 patterns and they are from gc4 and gd4. Mappings of 5-bit data word to these 10-bit code words are:

| Data | 000 to 00F | : | gc4(16 patterns, RDS = +2) |
| Data | 010 to 01F | : | gd4(16 patterns, RDS = +4) |

Subgroup ha4 includes 16 patterns and they are from gd3 and ge3. Mappings of 4-bit data word to these 10-bit code words are:

| Data | 000 to 007 | : | gd3(8 patterns, RDS = +4) |
| Data | 008 to 00F | : | ge3(8 patterns, RDS = +6) |

Note that all "ha" patterns have RDS of +2, +4 or +6.

TABLE 3-continued

Mapping Table of user fragments into 'h' group words.

Subgroup hb9 includes 512 patterns and they are from ha8, gb7, gb6, gb5, gb4, gb3 and gf3.
Mappings of 9-bit data word to these 10-bit code words are:

| Data | 000 to 0FF | : | ha8(256 patterns, RDS = +2, +4) |
| Data | 100 to 17F | : | gb7(128 patterns, RDS = 0) |
| Data | 180 to 1BF | : | gb6(64 patterns, RDS = 0) |
| Data | 1C0 to 1DF | : | gb5(32 patterns, RDS = 0) |
| Data | 1E0 to 1EF | : | gb4(16 patterns, RDS = 0) |
| Data | 1F0 to 1F7 | : | 9b3(8 patterns, RDS = 0) |
| Data | 1F8 to 1FF | : | gf3(8 patterns, RDS =+8) |

Subgroup hb6 includes 64 patterns and they are the same as ha6.
Mappings of 6-bit data word to these 10-bit code words are:

| Data | 000 to 03F | : | ha6(64 patterns, RDS = +4, +6) |

Subgroup hb5 includes 32 patterns and they are the same as ha5.
Mappings of 5-bit data word to these 10-bit code words are:

| Data | 000 to 01F | : | ha5(32 patterns, RDS = +2, +4) |

Subgroup hb4 includes 16 patterns and they are the same as ha4.
Mappings of 4-bit data word to these 10-bit code words are:

| Data | 000 to 00F | : | ha4(16 patterns, RDS = +4, +6) |

All "hb" patterns have RDS of 0, +2, +4, +6 or +8.

Subgroup hc9 includes 512 patterns and they are from ha8, gb7, gb6, gb5, gb4, gb3 gb2, gc1 and -gc1. Mappings of 9-bit data word to these 10-bit code words are:

| Data | 000 to 0FF | : | ha8(256 patterns, RDS = +2, +4) |
| Data | 100 to 17F | : | gb7(128 patterns, RDS = 0) |
| Data | 180 to 1BF | : | gb6(64 patterns, RDS = 0) |
| Data | 1C0 to 1DF | : | gb5(32 patterns, RDS = 0) |
| Data | 1E0 to 1EF | : | gb4(16 patterns, RDS = 0) |
| Data | 1F0 to 1F7 | : | gb3(8 patterns, RDS = 0) |
| Data | 1F8 to 1FB | : | gb2(4 patterns, RDS = 0) |
| Data | 1FC to 1FD | : | gc1(2 patterns, RDS = +2) |
| Data | 1FE to 1FF | : | −gc1(2 patterns, RDS = −2) |

Subgroup hc8 includes 256 patterns and they are from −gc7, −gc6 and ha6. Mappings of 8-bit data word to these 10-bit code words are:

| Data | 000 to 07F | : | −gc7(128 patterns, RDS = −2) |
| Data | 080 to 0BF | : | −gc6(64 patterns, RDS = −2) |
| Data | 0C0 to 0FF | : | ha6(64 patterns, RDS = +4, +6) |

Subgroup hc6 includes 64 patterns and they are from ha5, −gc4 and ha4. Mappings of 6-bit data word to these 10-bit code words are:

| Data | 000 to 01E | : | ha5(32 patterns, RDS = +2, +4) |
| Data | 020 to 02F | : | −gc4(16 patterns, RDS = −2) |
| Data | 030 to 03F | : | ha4(16 patterns, RDS = +4, +6) |

All "hc" patterns have RDS of−2, 0, +2, +4, or +6.

TABLE 3-continued

Mapping Table of user fragments into 'h' group words.

Subgroup hd9 includes 512 patterns and they are the same as hc9.
Mappings of 9-bit data word to these 10-bit code words are:

| Data | 000 to 1FF | : | hc9(512 patterns, RDS = −2, 0, +2, +4) |

Subgroup hd8 includes 256 patterns and they are from −gc7, −gc6, gd5 and −gd5. Mappings of 8-bit data word to these 10-bit code words are:

| Data | 000 to 07F | : | −gc7(128 patterns, RDS = −2) |
| Data | 080 to 0BF | : | −gc6(64 patterns, RDS = −2) |
| Data | 0C0 to 0DF | : | gd5(32 patterns, RDS = +4) |
| Data | 0E0 to 0FF | : | −gd5(32 patterns, RDS = −4) |

Subgroup hd7 includes 128 patterns and they are from −gd6, ha5, −gc4, gd3, and −gd3. Mappings of 8-bit data word to these 10-bit code words are:

| Data | 000 to 03F | : | −gd6(64 patterns, RDS = −4) |
| Data | 040 to 05F | : | ha5(32 patterns, RDS = +2, +4) |
| Data | 060 to 06F | : | −gc4(16 patterns, RDS = −2) |
| Data | 070 to 077 | : | gd3(8 patterns, RDS = +4) |
| Data | 078 to 07F | : | −gd3(8 patterns, RDS = −4) |

All "hd" patterns have RDS of −4, −2, 0, +2 or +4.

Subgroup he9 includes 512 patterns and they are the equivalent to the inverse of hc9. Mappings of 9-bit data word to these 10-bit code words are:

| Data | 000 to 1FF | : | −hc9(512 patterns, RDS = −4, −2, 0, +2) |

Subgroup he8 includes 256 patterns and they are the equivalent to the inverse of hc8. Mappings of 8-bit data word to these 10-bit code words are:

| Data | 000 to 0FF | : | −hc8(256 patterns, RDS = −6, −4, +2) |

All "he" patterns have RDS of −6, −4, −2, 0, or +2.

The lookup tables can be assembled based on the current state and the 'g' group and 'h' group words. Tables 4 to 6 indicate how the 19-bit data words can be mapped into 20-bit code words. The 19-bit data word is broken into three fragments. The first fragment is a bit pattern of the most significant bits of the data word. The second and third fragments are mapped into 'g' and 'h' segments, respectively. The 20-bit code word is composed of two 10-bit code segments. The first code segment is selected from the 'g' group and the second code segment is selected from the 'h' group. Depending on the current state of the encoder, code words are chosen from the corresponding table. Tables for states −4, −2 and 0 are shown while state +4 uses the inverse code words for state −4 and state +2 uses the inverse code words for state −2. In the lookup tables, "Pn." stands for the particular pattern number of the mapping performed. There are 39 patterns for state −4, 19 patterns for state −2 and 16 patterns for state 0. The values "G type" and "H type" correspond to which 'g' and 'h' subgroup is in the particular pattern. These values can further be used when decoding the code word.

TABLE 4

Lookup table for data word when current state is −4.
Starting State = S (−4)

| 18 | 17 | 16 | 15 | 14 | 13 | 12 | 11 | 10 | 9 | 8 | 7 | 6 | 5 | 4 | 3 | 2 | 1 | 0 | Pn. | G type | H type |
|---|---|---|---|---|---|---|---|---|---|---|---|---|---|---|---|---|---|---|---|---|---|
| 0 | 0 | 0 | | | | gb7 | | | | | | | hb9 | | | | | | 1 | 07 | 19 |
| 0 | 0 | 1 | | | | gc7 | | | | | | | hc9 | | | | | | 2 | 17 | 29 |
| 0 | 1 | 0 | 0 | | | −gc7 | | | | | | | ha8 | | | | | | 3 | 97 | 08 |
| 0 | 1 | 0 | 1 | | | gb6 | | | | | | | hb9 | | | | | | 4 | 06 | 19 |
| 0 | 1 | 1 | 0 | | | gc7 | | | | | | | hc8 | | | | | | 5 | 17 | 28 |
| 0 | 1 | 1 | 1 | | | gc6 | | | | | | | hc9 | | | | | | 6 | 16 | 29 |
| 1 | 0 | 0 | 0 | | | gd6 | | | | | | | hd9 | | | | | | 7 | 26 | 39 |
| 1 | 0 | 0 | 1 | 0 | | −gc6 | | | | | | | ha8 | | | | | | 8 | 96 | 08 |
| 1 | 0 | 0 | 1 | 1 | | gb5 | | | | | | | hb9 | | | | | | 9 | 05 | 19 |
| 1 | 0 | 1 | 0 | 0 | | gc6 | | | | | | | hc8 | | | | | | 10 | 16 | 28 |
| 1 | 0 | 1 | 0 | 1 | | gd6 | | | | | | | hd8 | | | | | | 11 | 26 | 38 |
| 1 | 0 | 1 | 1 | 0 | | gd5 | | | | | | | hd9 | | | | | | 12 | 25 | 39 |
| 1 | 0 | 1 | 1 | 1 | | ge5 | | | | | | | he9 | | | | | | 13 | 35 | 49 |
| 1 | 1 | 0 | 0 | 0 | 0 | | −gc7 | | | | | | ha6 | | | | | | 14 | 97 | 06 |
| 1 | 1 | 0 | 0 | 0 | 1 | | gb7 | | | | | | hb6 | | | | | | 15 | 07 | 16 |
| 1 | 1 | 0 | 0 | 1 | 0 | gb4 | | | | | | | hb9 | | | | | | 16 | 04 | 19 |
| 1 | 1 | 0 | 0 | 1 | 1 | | gc7 | | | | | | hc6 | | | | | | 17 | 17 | 26 |
| 1 | 1 | 0 | 1 | 0 | 0 | gc4 | | | | | | | hc9 | | | | | | 18 | 14 | 29 |
| 1 | 1 | 0 | 1 | 0 | 1 | | gd6 | | | | | | hd7 | | | | | | 19 | 26 | 37 |
| 1 | 1 | 0 | 1 | 1 | 0 | | gd5 | | | | | | hd8 | | | | | | 20 | 25 | 38 |
| 1 | 1 | 0 | 1 | 1 | 1 | gd4 | | | | | | | hd9 | | | | | | 21 | 24 | 39 |
| 1 | 1 | 1 | 0 | 0 | 0 | ge5 | | | | | | | he8 | | | | | | 22 | 35 | 48 |
| 1 | 1 | 1 | 0 | 0 | 1 | 0 | | −gc7 | | | | | | ha5 | | | | | 23 | 97 | 05 |
| 1 | 1 | 1 | 0 | 0 | 1 | 1 | | −gc6 | | | | | | ha6 | | | | | 24 | 96 | 06 |
| 1 | 1 | 1 | 0 | 1 | 0 | 0 | | gb7 | | | | | | hb5 | | | | | 25 | 07 | 15 |
| 1 | 1 | 1 | 0 | 1 | 0 | 1 | | gb6 | | | | | | hb6 | | | | | 26 | 06 | 16 |
| 1 | 1 | 1 | 0 | 1 | 1 | 0 | gb3 | | | | | | | hb9 | | | | | 27 | 03 | 19 |
| 1 | 1 | 1 | 0 | 1 | 1 | 1 | | gc6 | | | | | | hc6 | | | | | 28 | 16 | 26 |
| 1 | 1 | 1 | 1 | 0 | 0 | 0 | gc4 | | | | | | | hc8 | | | | | 29 | 14 | 28 |
| 1 | 1 | 1 | 1 | 0 | 0 | 1 | | gd5 | | | | | | hd7 | | | | | 30 | 25 | 37 |
| 1 | 1 | 1 | 1 | 0 | 1 | 0 | | gd4 | | | | | | hd8 | | | | | 31 | 24 | 38 |
| 1 | 1 | 1 | 1 | 0 | 1 | 1 | gd3 | | | | | | | hd9 | | | | | 32 | 23 | 39 |
| 1 | 1 | 1 | 1 | 1 | 0 | 0 | ge3 | | | | | | | he9 | | | | | 33 | 33 | 49 |

TABLE 4-continued

Lookup table for data word when current state is −4.
Starting State = S (−4)

| 18 | 17 | 16 | 15 | 14 | 13 | 12 | 11 | 10 | 9 | 8 | 7 | 6 | 5 | 4 | 3 | 2 | 1 | 0 | Pn. | G type | H type |
|---|---|---|---|---|---|---|---|---|---|---|---|---|---|---|---|---|---|---|---|---|---|
| 1 | 1 | 1 | 1 | 1 | 0 | 1 | 0 | | | | −gc7 | | | | | ha4 | | | 34 | 97 | 04 |
| 1 | 1 | 1 | 1 | 1 | 0 | 1 | 1 | | | | −gc6 | | | | | ha5 | | | 35 | 96 | 05 |
| 1 | 1 | 1 | 1 | 1 | 1 | 0 | 0 | | | | gb7 | | | | | hb4 | | | 36 | 07 | 14 |
| 1 | 1 | 1 | 1 | 1 | 1 | 0 | 1 | | | | gb6 | | | | | hb5 | | | 37 | 06 | 15 |
| 1 | 1 | 1 | 1 | 1 | 1 | 1 | 0 | | | | gb5 | | | | | hb6 | | | 38 | 05 | 16 |
| 1 | 1 | 1 | 1 | 1 | 1 | 1 | 1 | | | | gd4 | | | | | hd7 | | | 39 | 24 | 37 |

TABLE 5

Lookup table for data word when current state is −2.
Starting State = S (−2)

| 18 | 17 | 16 | 15 | 14 | 13 | 12 | 11 | 10 | 9 | 8 | 7 | 6 | 5 | 4 | 3 | 2 | 1 | 0 | Pn. | G type | H type |
|---|---|---|---|---|---|---|---|---|---|---|---|---|---|---|---|---|---|---|---|---|---|
| 0 | 0 | 0 | | | | −gc7 | | | | | | | | hb9 | | | | | 1 | 97 | 19 |
| 0 | 0 | 1 | | | | gb7 | | | | | | | | hc9 | | | | | 2 | 07 | 29 |
| 0 | 1 | 0 | | | | gc7 | | | | | | | | hd9 | | | | | 3 | 17 | 39 |
| 0 | 1 | 1 | 0 | | | −gc6 | | | | | | | | hb9 | | | | | 4 | 96 | 19 |
| 0 | 1 | 1 | 1 | | | gb7 | | | | | | | | hc8 | | | | | 5 | 07 | 28 |
| 1 | 0 | 0 | 0 | | | gb6 | | | | | | | | hc9 | | | | | 6 | 06 | 29 |
| 1 | 0 | 0 | 1 | | | gc7 | | | | | | | | hd8 | | | | | 7 | 17 | 38 |
| 1 | 0 | 1 | 0 | | | gc6 | | | | | | | | hd9 | | | | | 8 | 16 | 39 |
| 1 | 0 | 1 | 1 | | | gd6 | | | | | | | | he9 | | | | | 9 | 26 | 49 |
| 1 | 1 | 0 | 0 | 0 | | gb6 | | | | | | | | hc8 | | | | | 10 | 06 | 28 |
| 1 | 1 | 0 | 0 | 1 | | gb5 | | | | | | | | hc9 | | | | | 11 | 05 | 29 |
| 1 | 1 | 0 | 1 | 0 | | gc7 | | | | | | | | hd7 | | | | | 12 | 17 | 37 |
| 1 | 1 | 0 | 1 | 1 | | gc6 | | | | | | | | hd8 | | | | | 13 | 16 | 38 |
| 1 | 1 | 1 | 0 | 0 | | gd6 | | | | | | | | he8 | | | | | 14 | 26 | 48 |
| 1 | 1 | 1 | 0 | 1 | | ge5 | | | | | | | | −hb9 | | | | | 15 | 35 | 59 |
| 1 | 1 | 1 | 1 | 0 | 0 | | | −gc7 | | | | | | hb6 | | | | | 16 | 97 | 16 |
| 1 | 1 | 1 | 1 | 0 | 1 | | | gb7 | | | | | | hc6 | | | | | 17 | 07 | 26 |
| 1 | 1 | 1 | 1 | 1 | 0 | | | gb5 | | | | | | hc8 | | | | | 18 | 05 | 28 |
| 1 | 1 | 1 | 1 | 1 | 1 | | | gb4 | | | | | | hc9 | | | | | 19 | 04 | 29 |

TABLE 6

Lookup table for data word when current state is 0.
Starting State = S0

| 18 | 17 | 16 | 15 | 14 | 13 | 12 | 11 | 10 | 9 | 8 | 7 | 6 | 5 | 4 | 3 | 2 | 1 | 0 | Pn. | G type | H type |
|---|---|---|---|---|---|---|---|---|---|---|---|---|---|---|---|---|---|---|---|---|---|
| 0 | 0 | 0 | | | | −gc7 | | | | | | | | hc9 | | | | | 1 | 97 | 29 |
| 0 | 0 | 1 | | | | gb7 | | | | | | | | hd9 | | | | | 2 | 07 | 39 |
| 0 | 1 | 0 | | | | gc7 | | | | | | | | he9 | | | | | 3 | 17 | 49 |
| 0 | 1 | 1 | 0 | | | −gc7 | | | | | | | | hc8 | | | | | 4 | 97 | 28 |
| 0 | 1 | 1 | 1 | | | −gc6 | | | | | | | | hc9 | | | | | 5 | 96 | 29 |
| 1 | 0 | 0 | 0 | | | gb7 | | | | | | | | hd8 | | | | | 6 | 07 | 38 |
| 1 | 0 | 0 | 1 | | | gb6 | | | | | | | | hd9 | | | | | 7 | 06 | 39 |
| 1 | 0 | 1 | 0 | | | gc7 | | | | | | | | he8 | | | | | 8 | 17 | 48 |
| 1 | 0 | 1 | 1 | | | gc6 | | | | | | | | he9 | | | | | 9 | 16 | 49 |
| 1 | 1 | 0 | 0 | | | gd6 | | | | | | | | −hb9 | | | | | 10 | 26 | 59 |
| 1 | 1 | 0 | 1 | 0 | | −gc6 | | | | | | | | hc8 | | | | | 11 | 96 | 28 |
| 1 | 1 | 0 | 1 | 1 | | gb7 | | | | | | | | hd7 | | | | | 12 | 07 | 37 |
| 1 | 1 | 1 | 0 | 0 | | gb6 | | | | | | | | hd8 | | | | | 13 | 06 | 38 |
| 1 | 1 | 1 | 0 | 1 | | gb5 | | | | | | | | hd9 | | | | | 14 | 05 | 39 |
| 1 | 1 | 1 | 1 | 0 | | gc6 | | | | | | | | he8 | | | | | 15 | 16 | 48 |
| 1 | 1 | 1 | 1 | 1 | | gd5 | | | | | | | | −hb9 | | | | | 16 | 25 | 59 |

As an example, assume the 19-bit user data received in step 202 is 0x2A3EC=010 1010 0011 1110 1100 and the current state received in step 204 is −4. Assuming the leading bit is d18, d18=0, d17=1, d16=0, d15=1, d14=0, d13=1, d12=0, d11=0, d10=0, d9=1, d8=1, d7=1, d6=1, d5=1, d4=0, d 3=1, d2=1, d1=0, d0=0. According to Table 4, which is for state −4, when d(18:15)=0101, which is the first fragment, d(14:9) (the second fragment) is mapped according to subgroup "gb6" to obtain the first 10-bit segment and d(8:0) (the third fragment) is mapped according to subgroup "hb9" to obtain the second 10-bit segment of the 20-bit code word. As ascertained from the data word, the second fragment d(14:9) is 010001=0x011. In step 210, according to the mapping table for subgroup "gb6", the 10-bit segment should be 0x343=1101000011. For the second 10-bit segment of the code word, as obtained in step 212, the third fragment d(8:0)=111101100=0x1EC is mapped according to the mapping table for subgroup "hb9". Data between 0x1E=111100000 and 0x1EF=111101111 should use patterns from "gb4". Here, the four least significant bits d(3:0)=1100=0x00C are mapped according to the mapping table for subgroup "gb4". As a result, 0x00C maps into 0x08F=0010001111. Now, combining the first and second 10-bit segments in step 214 is performed to obtain the 20-bit code word of 1101000011 0010001111=0xD0C8F. The running digital sum of this code word is 0, thus the current state will remain −4 (−4+0=−4).

In one embodiment, the unrestrained sequence of 101010 . . . is avoided. Code words having this sequence are eliminated. As a result, code words 0xAAAAA and 0x55555 are replaced by other code words, for example 0x83EAA and 0x43D55, respectively. These two examples are not used for other mappings and have the same RDS as the replaced patterns.

The details of the circuits and operations described below are examples and can be performed in hardware, software, firmware and/or combinations thereof. The functions of the circuits can be described with respect to various logic operations. In the case of circuits, these may be formed on one chip or various chips, as desired. Table 7 provides definitions for the symbols and logic operations used.

TABLE 7

Symbol definition:

| | |
|---|---|
| "\|" | Bitwise OR |
| "&" | Bitwise AND |
| "^" | Bitwise XOR |
| "!x" | Inverse of bit x |
| "!C(n:0)" | Inverse of all bits of word C |

Figure 3:
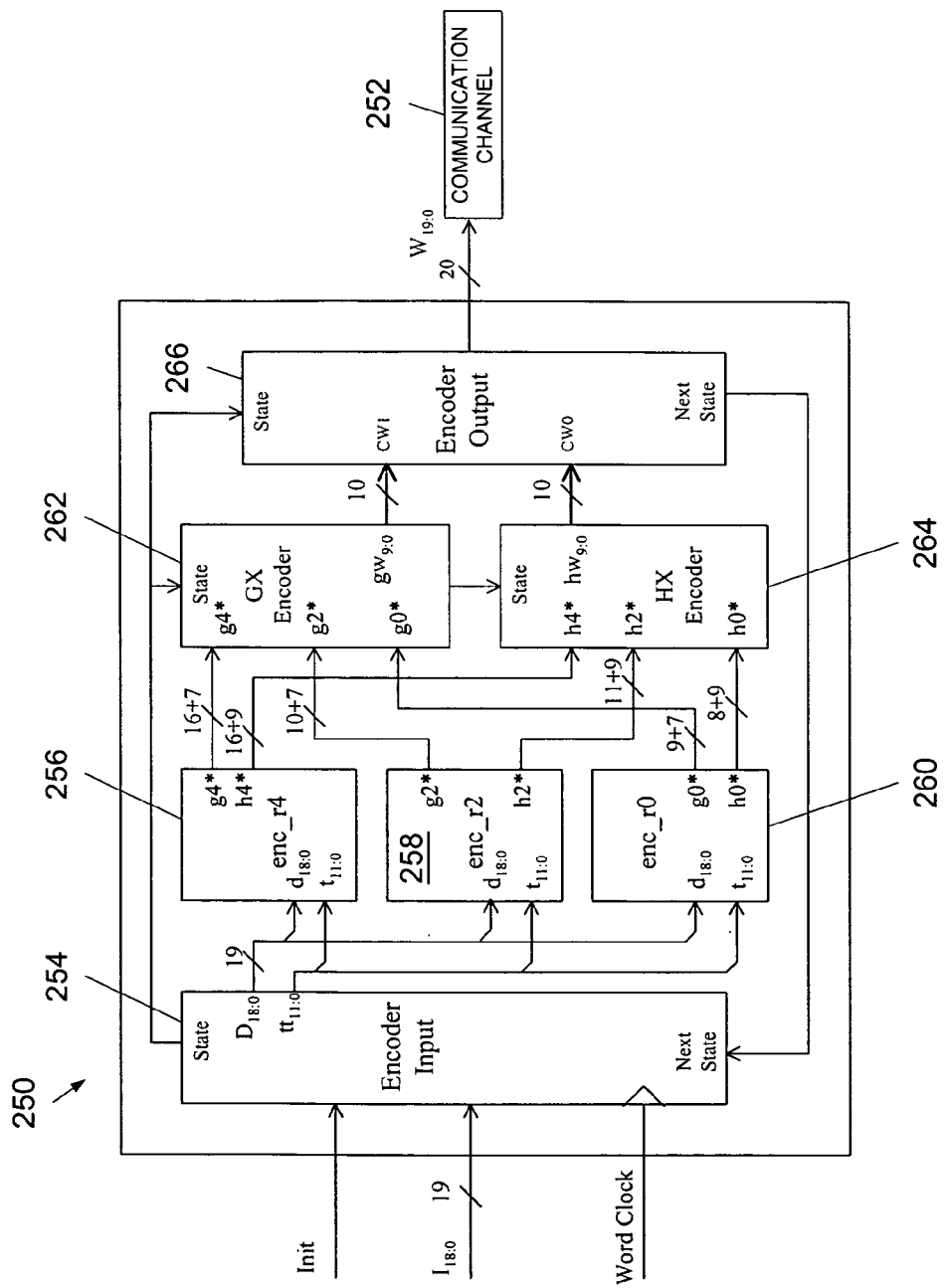
FIG. 3 is a block diagram of an encoder.

FIG. 3 illustrates a block diagram of an encoder 250 for encoding a user data word of 19 bits to a 20-bit code word. Encoder 250 communicates to a communications channel 252, which can comprise an arrangement of magnetic storage discs and heads as shown in FIG. 1. Channel 252 can also be other types of communication channels such as an optical, wireless or transmission line channel.

Encoder 250 receives as input an initialization signal, a user data word $I_{18:0}$ and a word clock. Encoder 250 outputs a code word $W_{19:0}$ to communication channel 252. An encoder input circuit 254 receives input to the encoder 250 as well as the next state of the system. The encoder input circuit 254 outputs a data word $D_{18:0}$ and a pattern select value $tt_{11:0}$ to encoder circuits 256, 258 and 260, identified as enc_r4, enc_r2 and enc_r0. Encoder circuit 254 also provides a state value to a GX encoder 262, an HX encoder 264 and an encoder output circuit 266. The GX encoder 262 and HX encoder 264 receive values from encoder circuits 256, 258 and 260 in order to generate the 'g' group words and the 'h' group words. The GX encoder 262 and HX encoder 264 provide the 'g' group words and 'h' group words to the encoder output circuit 266. Ultimately, output encoder circuit 266 provides a code word to communication channel 252.

Figure 4:
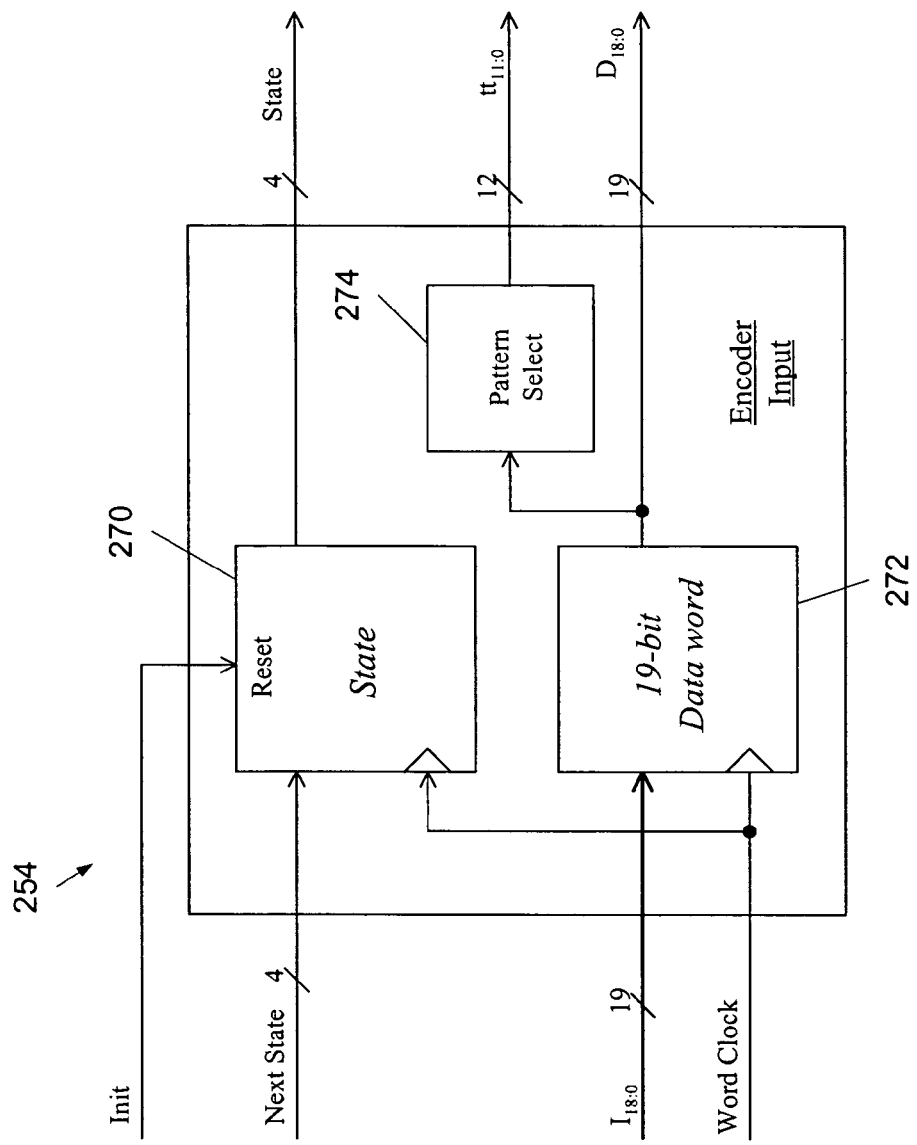
FIG. 4 is a block diagram of an encoder input circuit.

FIG. 4 illustrates a block diagram of encoder input circuit 254. Encoder input 254 includes a state register 270, a 19-bit data word block 272 and a pattern select circuit 274. Before the first data word is clocked into the input block, the initialization signal (Init) is used to initialize the state to zero. State is a four-bit sign value representing the current state. The next state value is received from the encoder output circuit 266 and is clocked in as the current state upon the rising edge of the word clock. Additionally, at 19-bit data word block 272, the data word $I_{18:0}$ is clocked in upon a rising edge of the word clock. The 19-bit data word is sent to pattern select circuit 274. Pattern select circuit 274 prepares a value $tt_{11:0}$ indicative of the four most significant bits of the data word. Encoder input circuit 254 operates in a manner shown in Table 8.

TABLE 8

Input: $I_{18:0}$ (19 bits), Init, Word Clock, Next State$_{3:0}$
Output: $D_{18:0}$ , $tt_{11:0}$, State$_{3:0}$
Pattern Select

| | |
|---|---|
| tt0 = !d18& d17& !d16& !d15 | tt1 = !d18& d17& !d16& d15 |
| tt2 = !d18& d17& d16& !d15 | tt3 = !d18& d17& d16& d15 |
| tt4 = d18& !d17& !d16& !d15 | tt5 = d18& !d17& !d16& d15 |
| tt6 = d18& !d17& d16& !d15 | tt7 = d18& !d17& d16& d15 |
| tt8 = d18& d17& !d16& !d15 | tt9 = d18& d17& !d16& d15 |
| tt10 = d18& d17& d16& !d15 | tt11 = d18& d17& d16& d15 |

Figure 5:
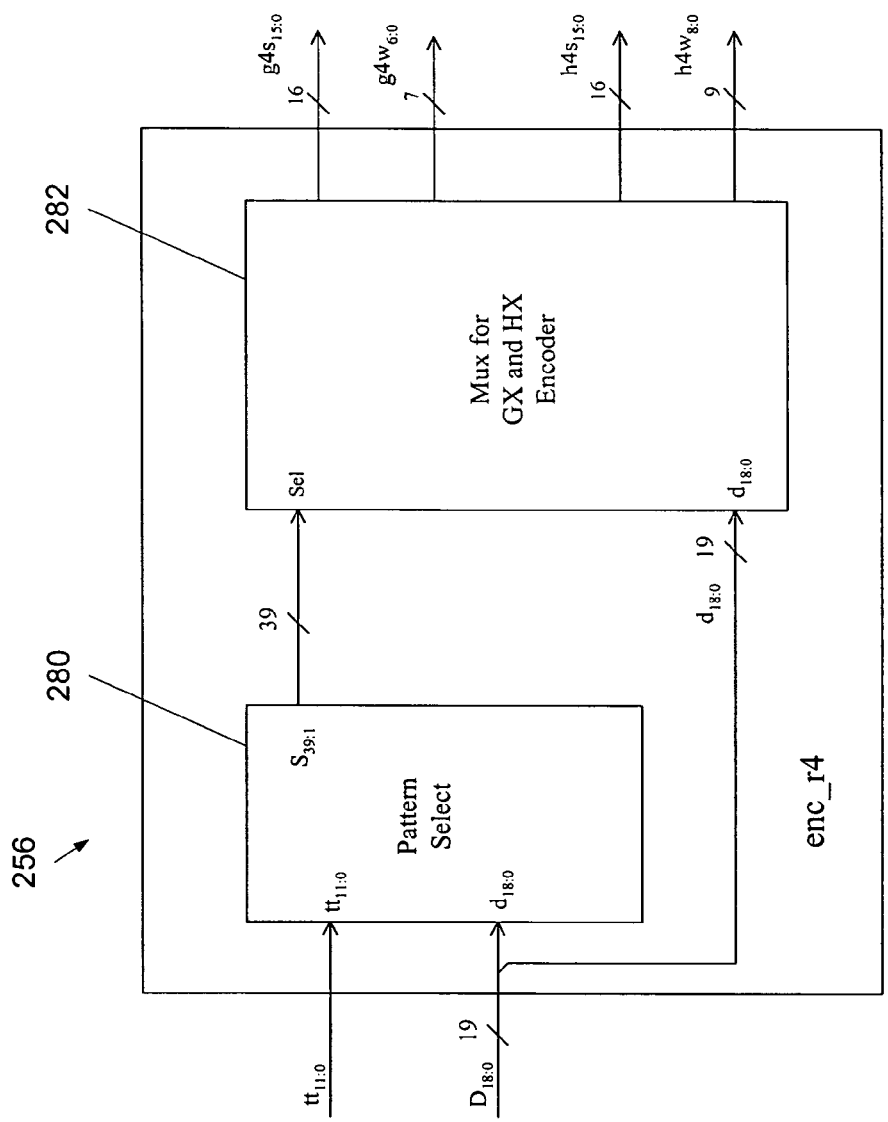
FIG. 5 is a block diagram of a first encoder circuit.

FIG. 5 illustrates a block diagram of encoder circuit 256, identified as enc_r4. Encoder circuit 256 includes a pattern select circuit 280 and a mux circuit 282. Encoder circuit 256 operates to select a code word when the current state is 4. Pattern select circuit 280 selects which of the 39 patterns of the lookup table shown in Table 4 is used given the data word $d_{18:0}$. The value that pattern select circuit 280 issues is a 39-bit word indicating which pattern should be selected. Mux circuit 282 utilizes the select value $S_{39:1}$ and the data word $D_{18:0}$ to output a selection of which 'g' subgroup to use (g4S$_{15:0}$), which bits of the data word will be mapped to the 'g' word (g4w$_{6:0}$), which 'h' subgroup to use (h4s$_{15:0}$) and which bits of data word will be used to map the 'h' word (h4w$_{8:0}$). The calculations of encoder circuit 256 are shown in Table 9.

TABLE 9

Input: d18,d17,d16,d15,d14,d13,d12,d11,d10,d9,d8,d7,d6,d5,d4,d3,d2,d1,d0 (19-bit Dataword)
tt11,tt10,tt9,tt8,tt7,tt6,tt5,tt4,tt3,tt2,tt1,tt0
Output: g4w6,g4w5,g4w4,g4w3,g4w2,g4w1,g4w0 (7-bit word)
g4s15,g4s14,g4s13,g4s12,g4s11,g4s10,g4s9,g4s8,g4s7,g4s6,g4s5,g4s4,g4s3,g4s2,g4s1,g4s0
h4w8,h4w7,h4w6,h4w5,h4w4,h4w3,h4w2,h4w1,h4w0 (9-bit word)
h4s15,h4s14,h4s13,h4s12,h4s11,h4s10,h4s9,h4s8,h4s7,h4s6,h4s5,h4s4,h4s3,h4s2,h4s1,h4s0
Pattern Select of enc_r4

| | | | |
|---|---|---|---|
| t4 = tt0 | t5 = tt1 | t6 = tt2 | t7 = tt3 |
| t8 = tt4 | t9 = tt5 | ta = tt6 | tb = tt7 |
| tc = tt8 | td = tt9 | te = tt10 | tf = tt11 |
| S1 = !d18&!d17&!d16 | | S2 = !d18&!d17& d16 | |
| S3 = t4 | | S4 = t5 | |

TABLE 9-continued

```
S5 =t6                      S6 =t7
S7 =t8                      S8 =t9&!d14
S9 =t9& d14                 S10=ta&!d14
S11=ta& d14                 S12=tb&!d14
S13=tb& d14                 S14=tc&!d14&!d13
S15=tc&!d14& d13            S16=tc& d14&!d13
S17=tc& d14& d13            S18=td&!d14&!d13
S19=td&!d14& d13            S20=td& d14&!d13
S21=td& d14& d13            S22=te&!d14&!d13
S23=te&!d14& d13&!d12       S24=te&!d14& d13& d12
S25=te& d14&!d13&!d12       S26=te& d14&!d13& d12
S27=te& d14& d13&!d12       S28=te& d14& d13& d12
S29=tf&!d14&!d13&!d12       S30=tf&!d14&!d13& d12
S31=tf&!d14& d13&!d12       S32=tf&!d14& d13& d12
S33=tf& d14&!d13&!d12       S34=tf& d14&!d13& d12&!d11
S35=tf& d14&!d13& d12&d11   S36=tf& d14& d13&!d12&!d11
S37=tf& d14& d13&!d12&d11   S38=tf& d14& d13& d12&!d11
S39=tf& d14& d13& d12&d11
```

MUX for GX and HX Encoder of enc_r4

For GX:
if(S1|S2|S4|S6|S7|S9|S12|S13|S16|S18|S21|S27|S32|S33)
    {g4w(6:0) = (d15,d14,d13,d12,d11,d10,d9) }
if(S3|S5|S8|S10|S11|S20|S22|S29|S31)
    {g4w(6:0) = (d14,d13,d12,d11,d10, d9,d8) }
if(S19|S30|S39)
    {g4w(6:0) = (d13,d12,d11,d10, d9, d8,d7) }
if(S14|S15|S17|S24|S26|S28|S38)
    {g4w(6:0) = (d12,d11,d10, d9, d8, d7,d6) }
if(S23|S25|S35|S37)
    {g4w(6:0) = (d11,d10, d9, d8, d7, d6,d5) }
if(S34|S36)
    {g4w(6:0) = (d10, d9, d8, d7, d6, d5,d4) }
if(S3|S14|S23|S34)    {g4s0=1, all other g4s=0 }
if(S8|S24|S35)        {g4s1=1, all other g4s=0 }
if(S1|S15|S25|S36)    {g4s2=1, all other g4s=0 }
if(S4|S26|S37)        {g4s3=1, all other g4s=0 }
if(S9|S38)            {g4s4=1, all other g4s=0 }
if(S16)               {g4s5=1, all other g4s=0 }
if(S27)               {g4s6=1, all other g4s=0 }
if(S2|S5|S17)        {g4s7=1, all other g4s=0 }
if(S6|S10|S28)       {g4s8=1, all other g4s=0 }
if(S18|S29)         {g4s9=1, all other g4s=0 }
if(S7|S11|S19)       {g4s10=1, all other g4s=0 }
if(S12|S20|S30)      {g4s11=1, all other g4s=0 }
if(S21|S31|S39)      {g4s12=1, all other g4s=0 }
if(S32)               {g4s13=1, all other g4s=0 }
if(S13|S22)         {g4s14=1, all other g4s=0 }
if(S33)               {g4s15=1, all other g4s=0 }
For HX:
h4w(8:0) = (d8,d7,d6,d5,d4,d3,d2,d1,d0)
if(S3|S8)              {h4s0=1, all other h4s=0 }
if(S14|S24)         {h4s1=1, all other h4s=0 }
if(S23|S35)         {h4s2=1, all other h4s=0 }
if(S34)               {h4s3=1, all other h4s=0 }
if(S1|S4|S9|S16|S27)  {h4s4=1, all other h4s=0 }
if(S15|S26|S38)      {h4s5=1, all other h4s=0 }
if(S25|S37)         {h4s6=1, all other h4s=0 }
if(S36)               {h4s7=1, all other h4s=0 }
if(S2|S6|S18)        {h4s8=1, all other h4s=0 }
if(S5|S10|S29)       {h4s9=1, all other h4s=0 }
if(S17|S28)         {h4s10=1, all other h4s=0 }
if(S7|S12|S21|S32)   {h4s11=1, all other h4s=0 }
if(S11|S20|S31)      {h4s12=1, all other h4s=0 }
if(S19|S30|S39)      {h4s13=1, all other h4s=0 }
if(S13|S33)         {h4s14=1, all other h4s=0 }
if(S22)               {h4s15=1, all other h4s=0 }

Figure 6:
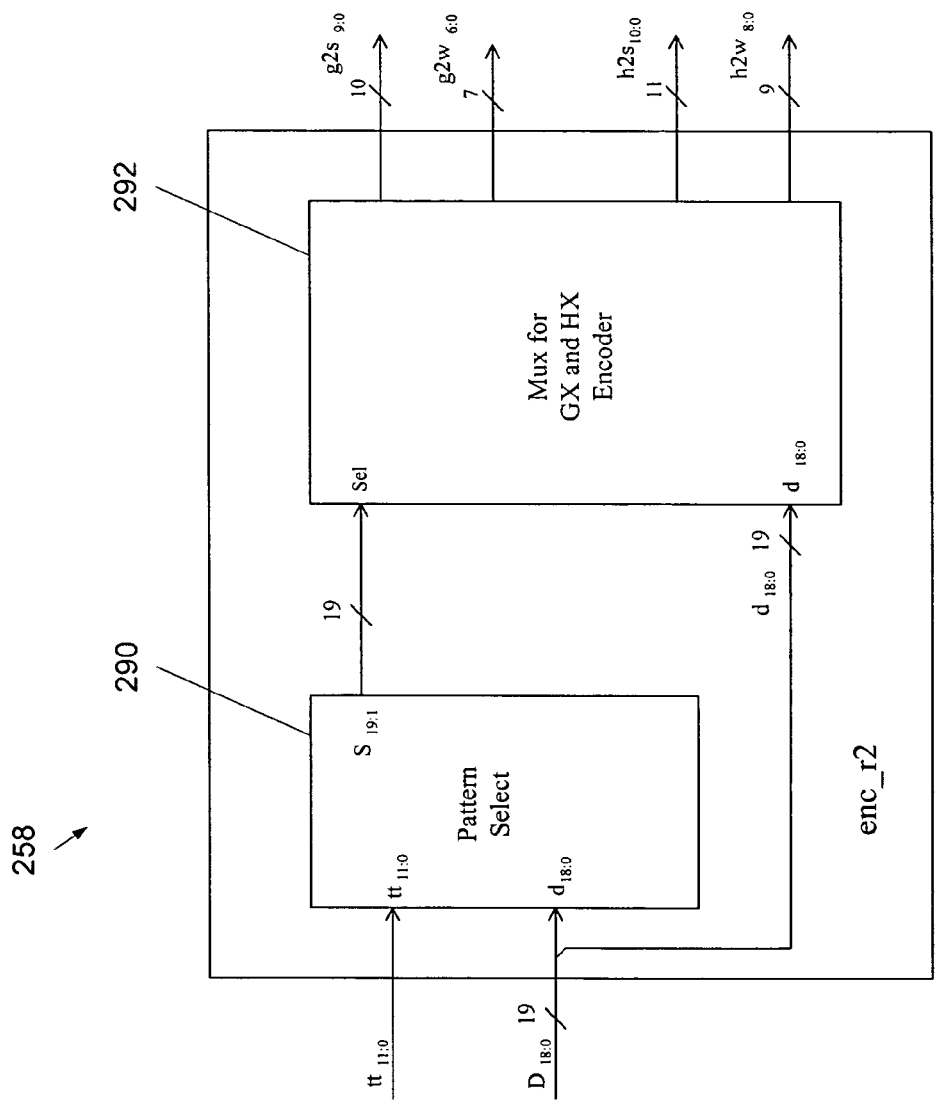
FIG. 6 is a block diagram of a second encoder circuit.
Figure 7:
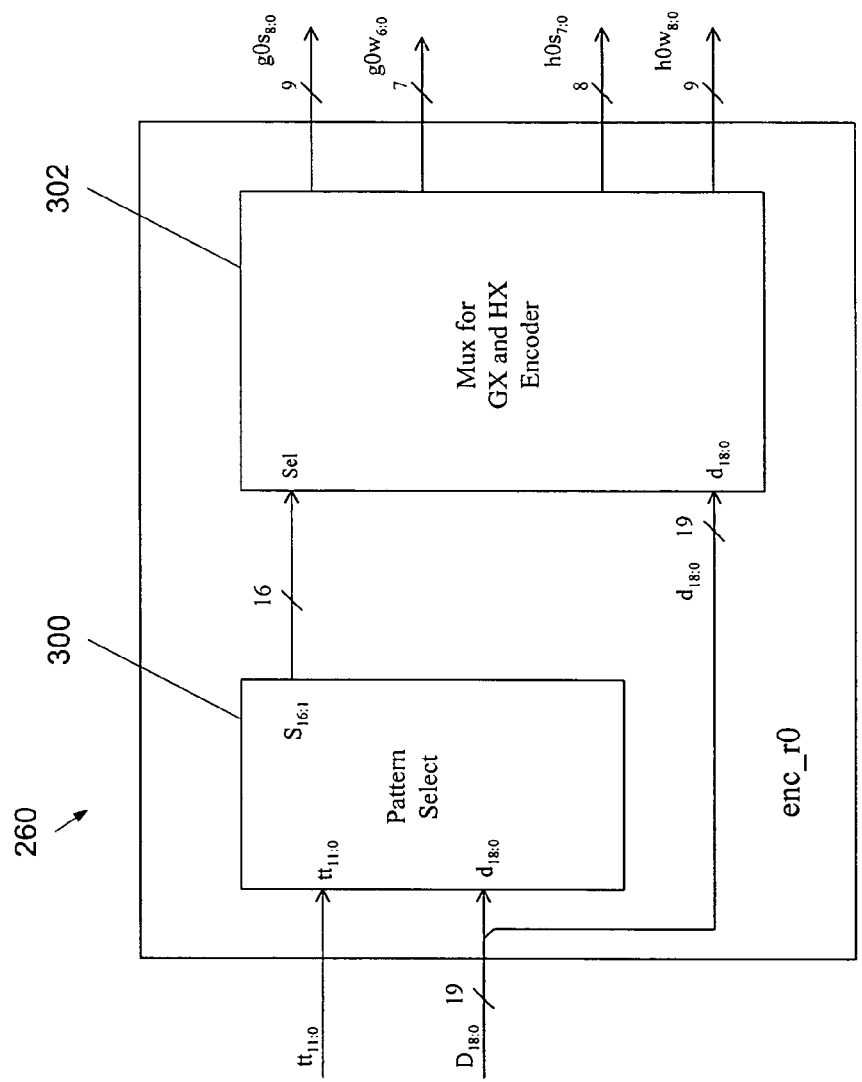
FIG. 7 is a block diagram of a third encoder circuit.

Encoder circuits 258 and 260, shown in block diagrams in FIGS. 6 and 7, operate similar to encoder circuit 256. Encoder circuit 258 includes a pattern select circuit 290 that selects a particular pattern from the lookup table in Table 5 and mux circuit 292 indicates the appropriate 'g' and 'h' subgroups and the bits of the data word that will be used for the 'g' and 'h' mappings. Encoder circuit 260 includes pattern select circuit 300 and mux circuit 302. Pattern select circuit 300 indicates which pattern should be used when the current state is zero. Mux circuit 302 outputs the appropriate 'g' and 'h' subgroups and the bits used for the respective 'g' and 'h' mappings. Encoder circuits 258 and 260 operate according to the tables shown in tables 10 and 11, respectively.

TABLE 10

Input: d18,d17,d16,d15,d14,d13,d12,d11,d10,d9,d8,d7,d6,d5,d4,d3,d2,d1,d0 (19-bit Dataword)
tt11,tt10,tt9,tt8,tt7,tt6,tt5,tt4,tt3,tt2,tt1,tt0
Output: g2w6,g2w5,g2w4,g2w3,g2w2,g2w1,g2w0 (7-bit word)
g2s9,g2s8,g2s7,g2s6,g2s5,g2s4,g2s3,g2s2,g2s1,g2s0
h2w8,h2w7,h2w6,h2w5,h2w4,h2w3,h2w2,h2w1,h2w0 (9-bit word)
h2s10,h2s9,h2s8,h2s7,h2s6,h2s5,h2s4,h2s3,h2s2,h2s1,h2s0

Pattern Select of enc_r2

```
t6 = tt2        t7 = tt3
t8 = tt4        t9 = tt5        ta = tt6        tb = tt7
tc = tt8        td = tt9        te = tt10       tf = tt11
S1 =!d18&!d17&!d16      S2 =!d18&!d17& d16
S3 =!d18& d17&!d16      S4 =t6
S5 =t7                  S6 =t8
S7 =t9                  S8 =ta
S9 =tb                  S10 =tc&!d14
S11=tc& d14             S12=td&!d14
S13=td& d14             S14=te&!d14
S15=te& d14             S16=tf&!d14&!d13
S17=tf&!d14& d13        S18=tf& d14&!d13
S19=tf& d14& d13
```

MUX for GX and HX Encoder of enc_r2

For GX:
if(S1|S2|S3|S4|S6|S8|S9|S11|S15|S19)
{g2w(6:0) = (d15,d14,d13,d12,d11,d10,d9) }
if(S5|S7|S10|S13|S14|S18)
{g2w(6:0) = (d14,d13,d12,d11,d10, d9,d8) }
if(S12)
{g2w(6:0) = (d13,d12,d11,d10, d9, d8,d7) }
if(S16|S17)
{g2w(6:0) = (d12,d11,d10, d9, d8, d7,d6) }

```
if(S1|S16)      {g2s0=1,  all other g2s=0 }
if(S4)          {g2s1=1,  all other g2s=0 }
if(S2|S5|S17)   {g2s2=1,  all other g2s=0 }
if(S6|S10)      {g2s3=1,  all other g2s=0 }
if(S11|S18)     {g2s4=1,  all other g2s=0 }
if(S19)         {g2s5=1,  all other g2s=0 }
if(S3|S7|S12)   {g2s6=1,  all other g2s=0 }
if(S8|S13)      {g2s7=1,  all other g2s=0 }
if(S9|S14)      {g2s8=1,  all other g2s=0 }
if(S15)         {g2s9=1,  all other g2s=0 }
```

For HX:
h2w(8:0) = (d8,d7,d6,d5,d4,d3,d2,d1,d0)

```
if(S1|S4)           {h2s0=1, all other h2s=0 }
if(S16)             {h2s1=1, all other h2s=0 }
if(S2|S6|S11|S19)   {h2s2=1, all other h2s=0 }
if(S5|S10|S18)      {h2s3=1, all other h2s=0 }
if(S17)             {h2s4=1, all other h2s=0 }
if(S3|S8)           {h2s5=1, all other h2s=0 }
if(S7|S13)          {h2s6=1, all other h2s=0 }
if(S12)             {h2s7=1, all other h2s=0 }
if(S9)              {h2s8=1, all other h2s=0 }
if(S14)             {h2s9=1, all other h2s=0 }
if(S15)             {h2s10=1, all other h2s=0 }
```

TABLE 11 enc_r0

Input: d18,d17,d16,d15,d14,d13,d12,d11,d10,d9,d8,d7,d6,d5,d4,d3,d2,d1,d0 (19-bit Dataword)
tt11,tt10,tt9,tt8,tt7,tt6,tt5,tt4,tt3,tt2,tt1,tt0
Output: g0w6,g0w5,g0w4,g0w3,g0w2,g0w1,g0w0 (7-bit word)
g0s8,g0s7,g0s6,g0s5,g0s4,g0s3,g0s2,g0s1,g0s0
h0w8,h0w7,h0w6,h0w5,h0w4,h0w3,h0w2,h0w1,h0w0 (9-bit word)
h0s7,h0s6,h0s5,h0s4,h0s3,h0s2,h0s1,h0s0

Pattern Select of enc_r0

```
t6 = tt2        t7 = tt3
t8 = tt4        t9 = tt5        ta = tt6        tb = tt7
tc = tt8        td = tt9        te = tt10       tf = tt11
S1 =!d18&!d17&!d16      S2 =!d18&!d17& d16
S3 =!d18& d17&!d16      S4 =t6
S5 =t7                  S6 =t8
S7 =t9                  S8 =ta
S9 =tb                  S10 =tc
```

TABLE 11-continued

```
S11=td&!d14        S12=td& d14
S13=te&!d14        S14=te& d14
S15=tf&!d14        S16=tf& d14
MUX for GX and HX Encoder of enc_r0

For GX:
if(S1|S2|S3|S5|S7|S9|S10|S14|S16)
          {g0w(6:0) = (d15,d14,d13,d12,d11,d10,d9) }
if(S4|S6|S8|S11|S13|S15)
          {g0w(6:0) = (d14,d13,d12,d11,d10, d9,d8) }
if(S12)
          {g0w(6:0) = (d13,d12,d11,d10, d9, d8,d7) }
if(S1|S4)      {g0s0=1,   all other g0s=0 }
if(S5|S11)     {g0s1=1,   all other g0s=0 }
if(S2|S6|S12)  {g0s2=1,   all other g0s=0 }
if(S7|S13)     {g0s3=1,   all other g0s=0 }
if(S14)        {g0s4=1,   all other g0s=0 }
if(S3|S8)      {g0s5=1,   all other g0s=0 }
if(S9|S15)     {g0s6=1,   all other g0s=0 }
if(S10)        {g0s7=1,   all other g0s=0 }
if(S16)        {g0s8=1,   all other g0s=0 }
For HX:
h0w(8:0) = (d8,d7,d6,d5,d4,d3,d2,d1,d0)
if(S1|S5)      {h0s0=1,   all other h0s=0 }
if(S4|S11)     {h0s1=1,   all other h0s=0 }
if(S2|S7|S14)  {h0s2=1,   all other h0s=0 }
if(S6|S13)     {h0s3=1,   all other h0s=0 }
if(S12)        {h0s4=1,   all other h0s=0 }
if(S3|S9)      {h0s5=1,   all other h0s=0 }
if(S8|S15)     {h0s6=1,   all other h0s=0 }
if(S10|S16)    {h0s7=1,   all other h0s=0 }
```

Figure 8:
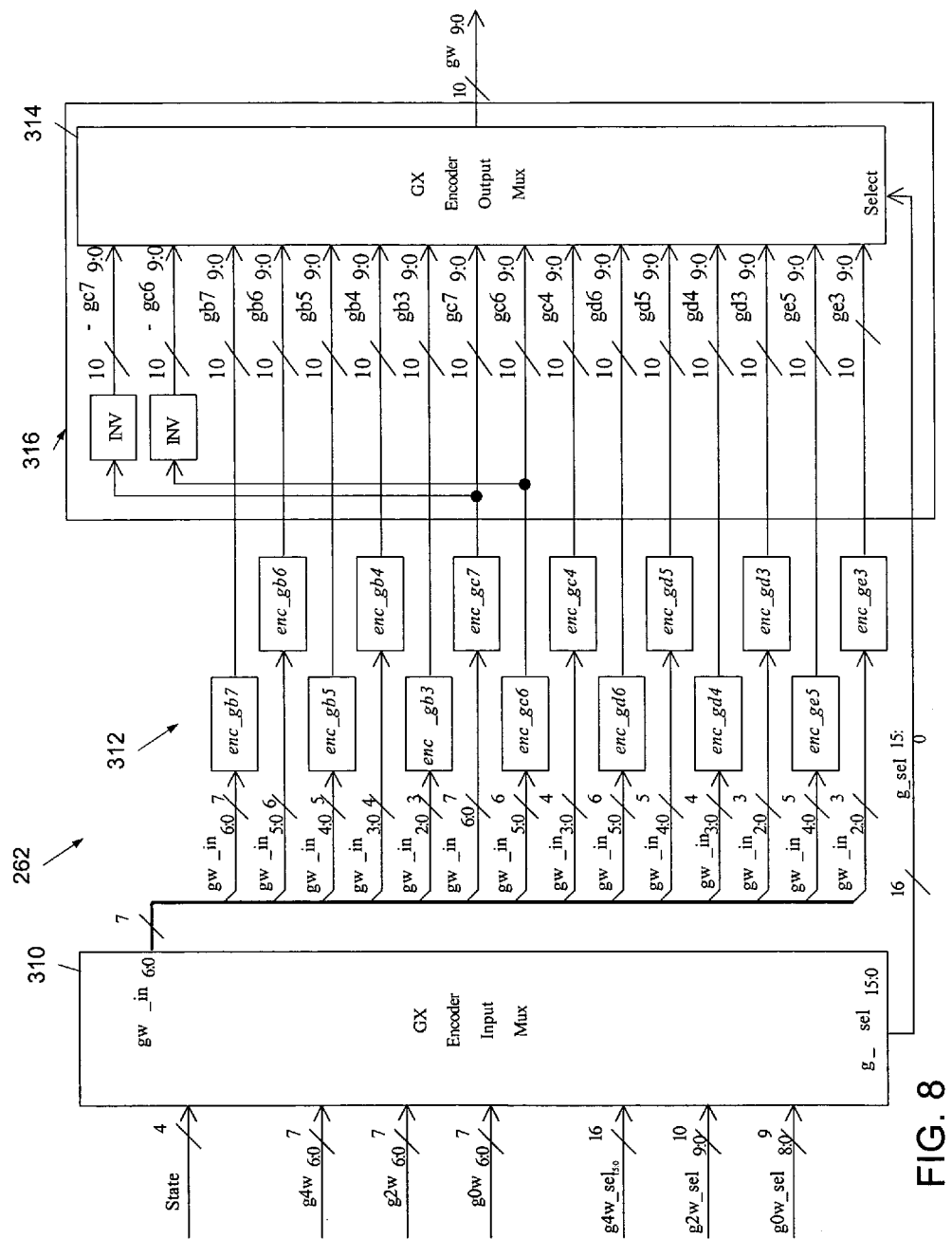
FIG. 8 is a block diagram of an encoder for generating a first segment of a code word.

FIG. 8 illustrates a block diagram of GX encoder 262. GX encoder 262 includes an GX encoder input mux 310, a plurality of subgroup encoder circuits 312 and a GX encoder output mux 314. GX encoder input mux 310 receives the 'g' values from the encoder circuits 256, 258 and 260 (g4w, g2w, g0w, g4w_sel, g2w_$_{sel}$, g0w_sel). Input mux 310 also receives the current state from encoder input circuit 254. Encoder input mux 310 sends the appropriate 'g' bits (the second fragment) received through each of the plurality of subgroup encoder circuits 312 based on the 'g' select values and the current state. The plurality of encoder circuits 312 map the second fragment (gw_in$_{6:0}$) according to the mapping table of Table 2. The mapped 10-bit segments are then output to the GX encoder output mux 314. In the event an inverse of the mapped subgroups is necessary, for example from enc_gx7 and enc_gc6, inverter circuits 316 are provided to invert the output from these respective circuits and send it to the GX encoder output mux 314. The GX encoder output mux selects the appropriate 10-bit segment according to the 'g' select value sent from GX encoder input mux 310. The GX encoder 262 operates according to calculations shown in Table 12.

Figure 9:
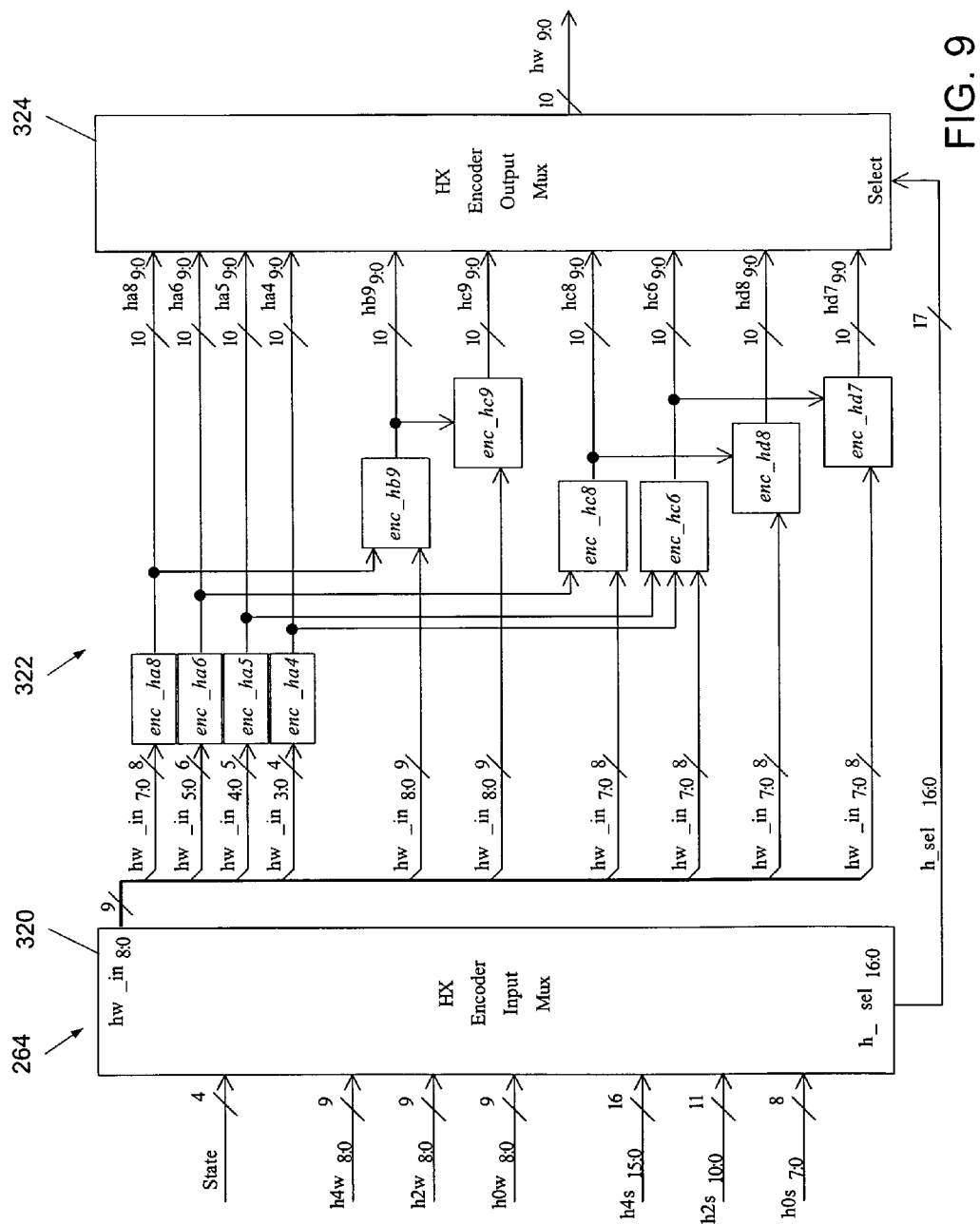
FIG. 9 is a block diagram of an encoder for generating a second segment of a code word.

FIG. 9 illustrates a block diagram of HX encoder 264, which operates similar to GX encoder 262. HX encoder 264 includes an HX encoder input mux 320, a plurality of subgroup encoder circuits 322 and an HX encoder output mux 324. HX encoder input mux 320 receives a signal indicative of the current state from the encoder input circuit 254 and 'h' values (h4w, h2w, h0w, h4s, h2s, h0s) from encoder circuits 256, 258 and 260. HX encoder input mux 320 selects the appropriate third fragment (either h4w, h2w and h0w) based on the current state and select values (h4s, h2s, h0s) and outputs the selection as hw_in. Also, HX encoder input mux 320 selects the particular subgroup based on the state and outputs a value h_sel based on the state. The plurality of subgroup encoder circuits 322 map the second fragment and send their respective mapped segments to the HX encoder output mux 324. The HX encoder output mux 324 selects the appropriate 10-bit segment based on h_sel. The 10-bit segment is then sent to encoder output circuit 266. The HX encoder 264 operates according to calculations shown in Table 13.

TABLE 13

HX Encoder

Input:   h4w(6:0), h2w(6:0), h0w(6:0), h4s(15:0), h2s(10:0), h0s(7:0), State(3:0)
Output:  hw(9:0)
HX Encoder Input Mux Input:   h4w(8:0), h2w(8:0), h0w(8:0), h4s(15:0), h2s(10:0), h0s(7:0), State(3:0)
Output:  hw_in(8:0), h_sel(16:0)
State(3:0) is a 4-bit signed value representing the current state.
if (State= −4 or State= 4)
    {      hw_in(8:0) = h4w(8:0),
           h_sel(15:0) = h4s(15:0),    h_sel(16) =0                    }
if (State= −2 or State= 2)
    {      hw_in(8:0) = h2w(8:0), TABLE 13-continued

```
        h_sel(0) =0,        h_sel(1) =0,         h_sel(2) =0,
        h_sel(3) =0,        h_sel(4) =h2s(0),    h_sel(5) =h2s(1),
        h_sel(6) =0,        h_sel(7) =0,         h_sel(8) =h2s(2),
        h_sel(9) =h2s(3),   h_sel(10)=h2s(4),    h_sel(11)=h2s(5),
        h_sel(12)=h2s(6),   h_sel(13)=h2s(7),    h_sel(14)=h2s(8),
        h_sel(15)=h2s(9),   h_sel(16)=h2s(10),                     }
if (State= 0)
    {   hw_in(8:0) = h0w(8:0),
        h_sel(0) =0,        h_sel(1) =0,         h_sel(2) =0,
        h_sel(3) =0,        h_sel(4) =0,         h_sel(5) =0,
        h_sel(6) =0,        h_sel(7) =0,         h_sel(8) =h0s(0),
        h_sel(9) =h0s(1),   h_sel(10)=0,         h_sel(11)=h0s(2),
        h_sel(12)=h0s(3),   h_sel(13)=h0s(4),    h_sel(14)=h0s(5),
        h_sel(15)=h0s(6),   h_sel(16)=h0s(7),                      }
```
Note: All the encoders enc_gc7, enc_gc6, enc_gc5, enc_gc4, enc_gc3, enc_gd6, enc_gd5, enc_gd4, enc_gd3, enc_ge5 and enc_ge3 used here in HX Encoder are identical to those defined in the GX Encoder.

enc_ha8

```
Input:   A(7:0)
Output:  CW(9:0)
        if(!A7)          CW(9:0) = enc_gc7(A(6:0));
        if(A7&!A6)       CW(9:0) = enc_gc6(A(5:0));
        if(A7&A6)        CW(9:0)= enc_gd6(A(5:0));
```
Note: CW(9:0)= enc_gc7(A(6:0)); means CW(9:0) is equal to the 10-bit output of block enc_gc7 when A(6:0) is the input to it.

enc_ha6

```
Input:   A(5:0)
Output:  CW(9:0)
        if(!A5)          CW(9:0)= enc_gd5(A(4:0));
        if(A5)           CW(9:0)= enc_ge5(A(4:0));
``` enc_ha5

```
Input:   A(4:0)
Output:  CW(9:0)
        if(!A4)          CW(9:0)= enc_gc4(A(3:0));
        if(A4)           CW(9:0)= enc_gd4(A(3:0));
``` enc_ha4

```
Input:   A(3:0)
Output:  CW(9:0)
        if(!A3)          CW(9:0)= enc_gd3(A(2:0));
        if(A3)           CW(9:0)= enc_ge3(A(2:0));
``` enc_hb9

```
Input:   A(8:0)
Output:  CW(9:0)
        if(!A8)                      CW(9:0)= enc_ha8(A(7:0));
        if(A8&!A7)                   CW(9:0)= enc_gb7(A(6:0));
        if(A8&A7&!A6)                CW(9:0)= enc_gb6(A(5:0));
        if(A8&A7&A6&!A5)             CW(9:0)= enc_gb5(A(4:0));
        if(A8&A7&A6&A5&!A4)          CW(9:0)= enc_gb4(A(3:0));
        if(A8&A7&A6&A5&A4&!A3)       CW(9:0)= enc_gb3(A(2:0));
        if(A8&A7&A6&A5&A4& A3)       CW(9:0)= enc_gf3(A(2:0));
``` enc_gf3

```
Input:   A42,A1,A0
Output:  C9,C8,C7,C6,C5,C4,C3,C2,C1,C0
        gf3a = !A2;
        gf3a9= gf3a;
        gf3a8= gf3a;
        gf3a7= gf3a &( A1 | A0 );
        gf3a6= gf3a &( A1 | !A0 );
        gf3a5= gf3a &( A0 | !A1 );
        gf3a4= gf3a &( !A1 | !A0 );
        gf3a3= gf3a;
        gf3a2= gf3a;
        gf3a1= gf3a;
        gf3a0= gf3a;
        gf3b = A2;
        gf3b9= gf3b;
        gf3b8= gf3b;
        gf3b7= gf3b;
        gf3b6= gf3b;
        gf3b5= gf3b;
        gf3b4= gf3b;
        gf3b3= gf3b &( A1 | A0 );
        gf3b2= gf3b &( A1 | !A0 );
        gf3b1= gf3b &( A0 | !A1 );
```

TABLE 13-continued

```
    gf3b0= gf3b &( !A1 | !A0 );
    C9 = gf3a9 |gf3b9;
    C8 = gf3a8 |gf3b8;
    C7 = gf3a7 |gf3b7;
    C6 = gf3a6 |gf3b6;
    C5 = gf3a5 |gf3b5;
    C4 = gf3a4 |gf3b4;
    C3 = gf3a3 |gf3b3;
    C2 = gf3a2 |gf3b2;
    C1 = gf3a1 |gf3b1;
    C0 = gf3a0 |gf3b0;
enc_hc9

Input:   A(8:0)
Output:  CW(9:0)
    if( !(A8&A7&A6&A5&A4&A3) )
    {   CW(9:0)= enc_hb9(hw);
    }
    else
    {   if(!A2)      CW(9:0)= enc_gb2(A(1:0));
        if(A2&!A1)   CW(9:0)= enc_gc1(A(0) );
        if(A2& A1)   CW(9:0)=!(enc_gc1(A(0)));
    }
enc_gb2

Input:   A1,A0
Output:  C9,C8,C7,C6,C5,C4,C3,C2,C1,C0
    C9= A0;
    C8=!A0;
    C7= A1;
    C6= A1;
    C5= A1;
    C4= A1;
    C3=!A1;
    C2=!A1;
    C1=!A1;
    C0=!A1;
enc_gc1
Input:   A0
Output:  C9,C8,C7,C6,C5,C4,C3,C2,C1,C0
    C9= 1;
    C8= 1;
    C7= A0;
    C6= A0;
    C5= A0;
    C4= A0;
    C3=!A0;
    C2=!A0;
    C1=!A0;
    C0=!A0;
enc_hc8

Input:   A(7:0)
Output:  CW(9:0)
    if(!A7)          CW(9:0)= !(enc_gc7(A(6:0)));
    if(A7&!A6)       CW(9:0)= !(enc_gc6(A(5:0)));
    if(A7&A6)        CW(9:0)= enc_ha6(A(5:0));
enc_hc6

Input:   A(5:0)
Output:  CW(9:0)
    if(!A5)          CW(9:0)= enc_ha5(A(4:0));
    if(A5&!A4)       CW(9:0)= !(enc_gc4(A(3:0)));
    if(A5& A4)       CW(9:0)= enc_ha4(A(3:0));
enc_hd8

Input:   A(7:0)
Output:  CW(9:0)
    if(!(A7&A6&A5))  CW(9:0)= enc_hc8(A(7:0));
    else             CW(9:0)= !(enc_gd5(A(4:0)));
enc_hd7

Input:   A(6:0)
Output:  CW(9:0)
    if(!A6)             CW(9:0)= !(enc_gd6(A(5:0)));
    if(A6&!(A5&A4&A3))  CW(9:0)= enc_hc6(A(5:0));
    if(A6& (A5&A4&A3))  CW(9:0)= !(enc_gd3(A(2:0)));
```

TABLE 13-continued

HX Encoder Output Mux

Input: ha8(9:0), ha6(9:0), ha5(9:0), ha4(9:0), hb9(9:0), hc9(9:0), hc8(9:0), hc6(9:0), hd8(9:0), hd7(9:0), h_sel(16:0)
Output: hw(9:0)
hb6(9:0) = ha6(9:0)
hb5(9:0) = ha5(9:0)
hb4(9:0) = ha4(9:0)
hd9(9:0) = hc9(9:0)
he9(9:0) =!hc9(9:0)
he8(9:0) =!hc8(9:0)
hf9(9:0) =!hb9(9:0)
If(h_sel0)       {hw(9:0)= ha8(9:0)   }
If(h_sel1)       {hw(9:0)= ha6(9:0)   }
If(h_sel2)       {hw(9:0)= ha5(9:0)   }
If(h_sel3)       {hw(9:0)= ha4(9:0)   }
If(h_sel4)       {hw(9:0)= hb9(9:0)   }
If(h_sel5)       {hw(9:0)= hb6(9:0)   }
If(h_sel6)       {hw(9:0)= hb5(9:0)   }
If(h_sel7)       {hw(9:0)= hb4(9:0)   }
If(h_sel8)       {hw(9:0)= hc9(9:0)   }
If(h_sel9)       {hw(9:0)= hc8(9:0)   }
If(h_sel10)      {hw(9:0)= hc6(9:0)   }
If(h_sel11)      {hw(9:0)= hd9(9:0)   }
If(h_sel12)      {hw(9:0)= hd8(9:0)   }
If(h_sel13)      {hw(9:0)= hd7(9:0)   }
If(h_sel14)      {hw(9:0)= he9(9:0)   }
If(h_sel15)      {hw(9:0)= he8(9:0)   }
If(h_sel16)      {hw(9:0)= hf9(9:0)   }

Figure 10:
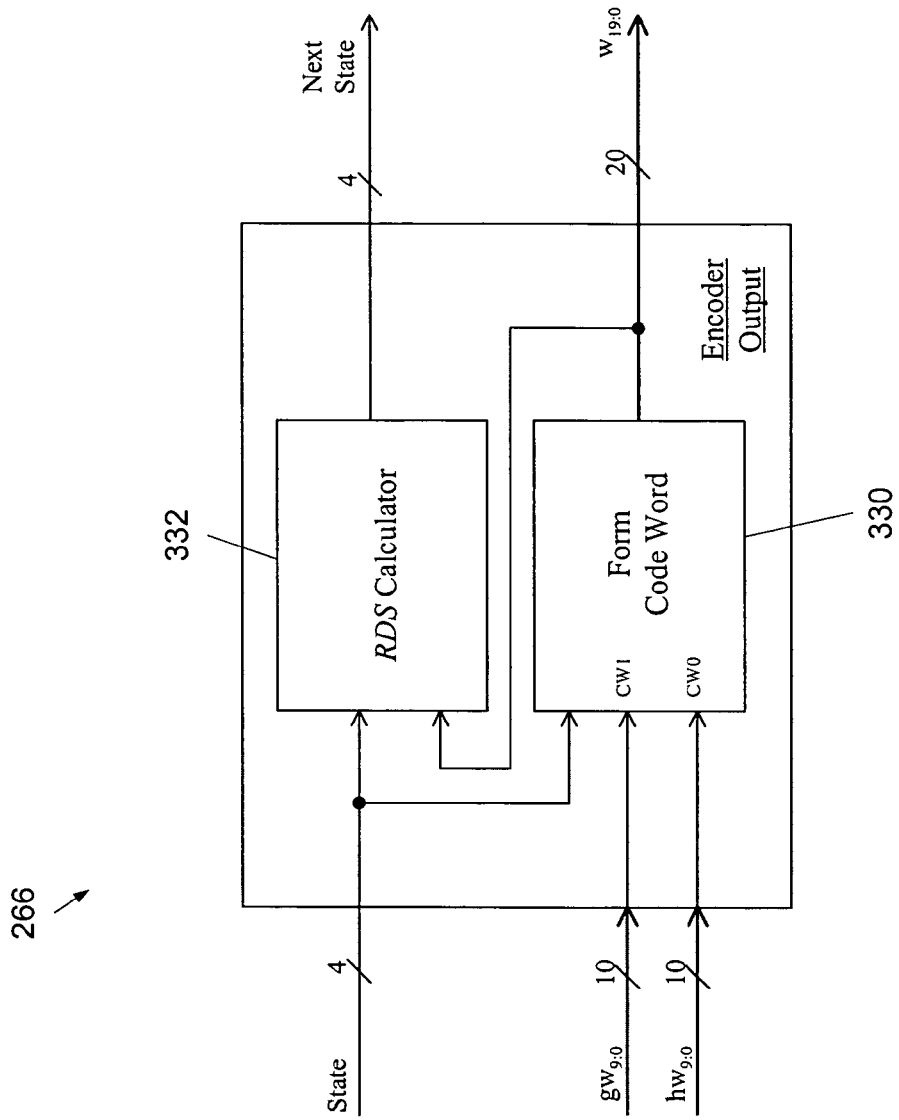
FIG. 10 is a block diagram of an encoder output circuit.

FIG. 10 illustrates a block diagram of encoder output circuit 266. Encoder output circuit 266 includes form code word circuit 330 and RDS calculator 332. Form code word circuit 334 combines the code words gw and hw received from the GX encoder and HX encoder, respectively, to form the code word. Also, if the state is negative, the entire code word is inversed to output the correct value. The output of form code word circuit 330 is sent to the communication channel 252 and RDS calculator 332. RDS calculator 332 receives the code word and the current state. RDS calculator 332 adds the values of the code word and the state to output the next state to the encoder input circuit 254, where it is used for a subsequent encoding. Encoder output circuit 266 operates according to calculations shown in Table 14.

Figure 11:
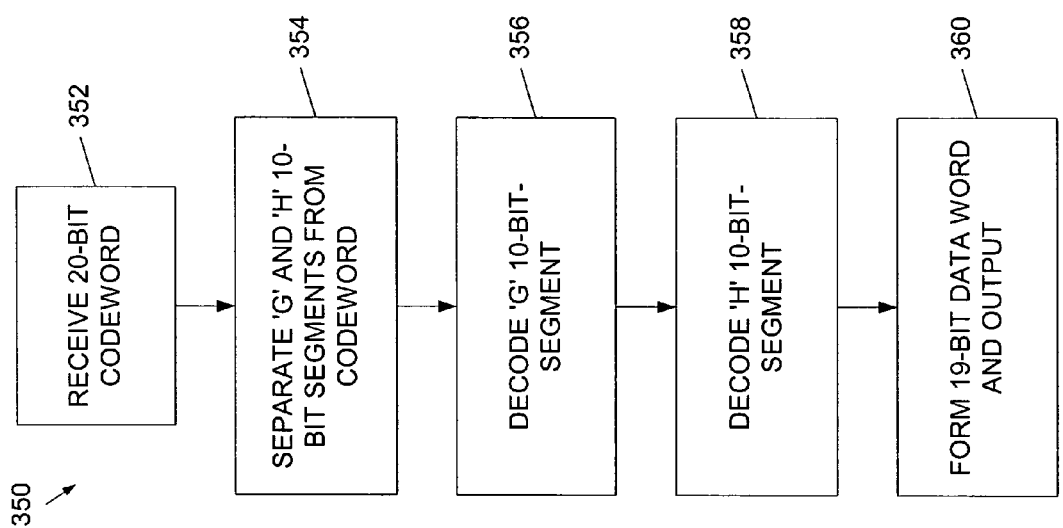
FIG. 11 is a flow diagram of a method of decoding digital information.

FIG. 11 illustrates a method 350 of decoding information received from communication channel 252. At step 352, the 20-bit code word is received from communication channel 252. Next, at step 354, the 'g' and 'h' bit segments from the code word are separated. At step 356, the 'g' 10-bit segment is decoded and at step 358 the 'h' 10-bit segment is decoded. Ultimately, at step 360, the 19-bit data word is formed and output.

Figure 12:
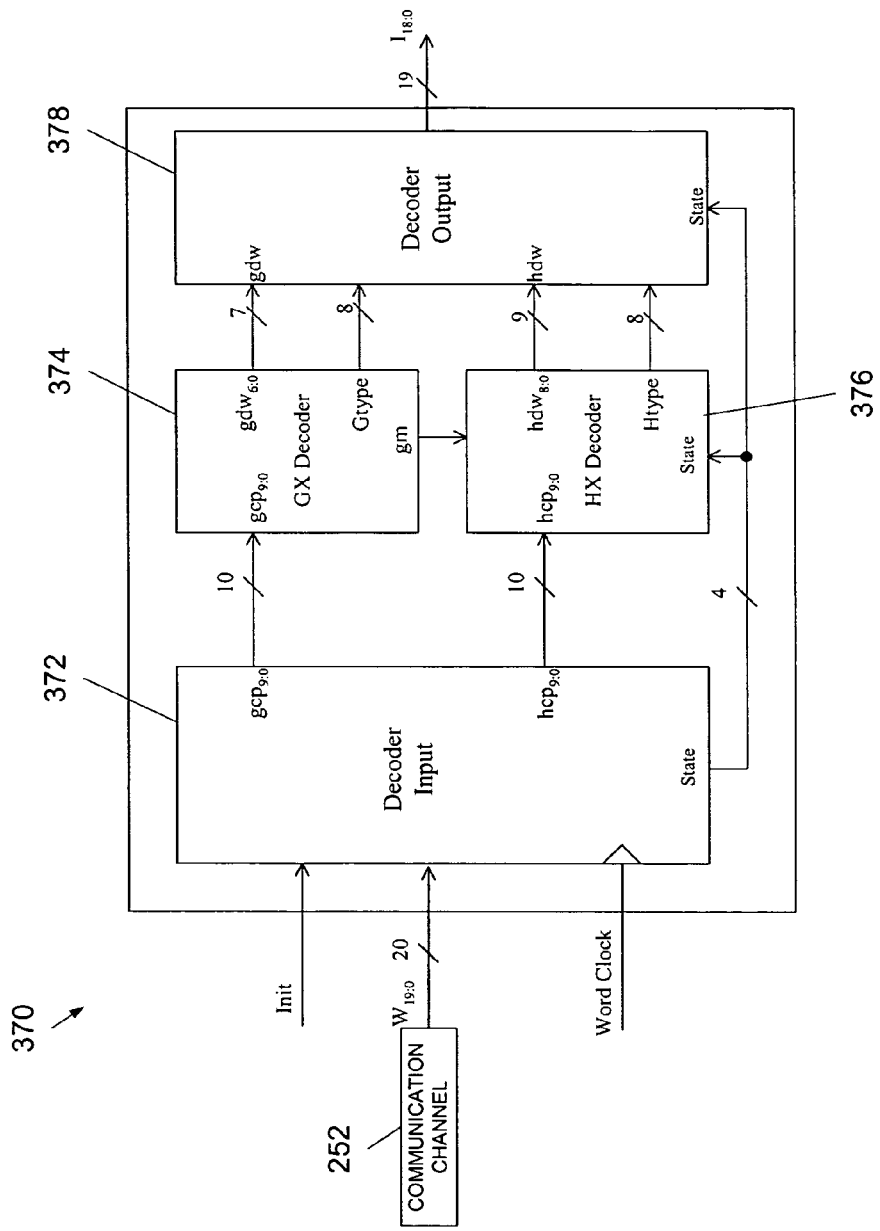
FIG. 12 is a block diagram of a decoder.

FIG. 12 illustrates a decoder 370 that decodes information received from communication channel 252. Decoder 370 includes a decoder input circuit 372, a GX decoder 374, an HX decoder 376 and a decoder output circuit 378. As discussed in more detail below, the decoder input circuit 372 receives an initialization signal, the code word $W_{19:0}$ and a

TABLE 14

Encoder Output Block

Input: gw(9:0), hw(9:0), State(3:0)
Output: W(19:0), NextState(3:0)
Form Code Word if (State<=0)    {W(19:10) = gw(9:0);   W( 9: 0) = hw(9:0);    }
if (State>0)     {W(19:10) =!gw(9:0);   W( 9: 0) =!hw(9:0);    }
if( W(19:0)==0xAAAAA)     W(19:0) = 0x83EAA;
if( W(19:0)==0x55555)      W(19:0) = 0x43D55;
RDS Calculator HW=W19+W18+W17+W16+W15+W14+W13+W12+W11+W10+W9+W8+W7+W6+W5+W4+W3+W2+W1+W0
RDS = (2*HW)−20
NextState= State + RDS
Note that Hamming weight(HW) of the code word W(19:0) is the sum of the
20 code bits. The running digital sum (RDS) of the code word is
calculated by subtracting the number of "0" by the number of "1" in the
code word. For example, if there are 13 "1" (HW=13) and number of "0" is
(20−HW), the RDS is HW−(20−HW)= (2*HW)−20.
In a sequence of code words, the cumulative RDS is the RDS of all bits
from the beginning of the first code word to the end of the current code
word. Note that the cumulative RDS in this design must be equal to
either −4, −2, 0, 2 or 4. This number is also considered as the state of
the encoder.

word clock. The decoder input circuit 372 ascertains the state from the code word and separates the code word into a 'g' segment $gcp_{9:0}$ and an 'h' segment $hcp_{9:0}$. The 'g' segments and the 'h' segments are sent to the GX decoder 374 and HX decoder 376, respectively. The GX decoder 374 and the HX decoder 376 decode the respective segments and provide an output to decoder output circuit 378. The decoder output circuit 378 forms a 19-bit data word using the state value sent from decoder input 372 and outputs the 19-bit data word $I_{18:0}$.

Figure 13:
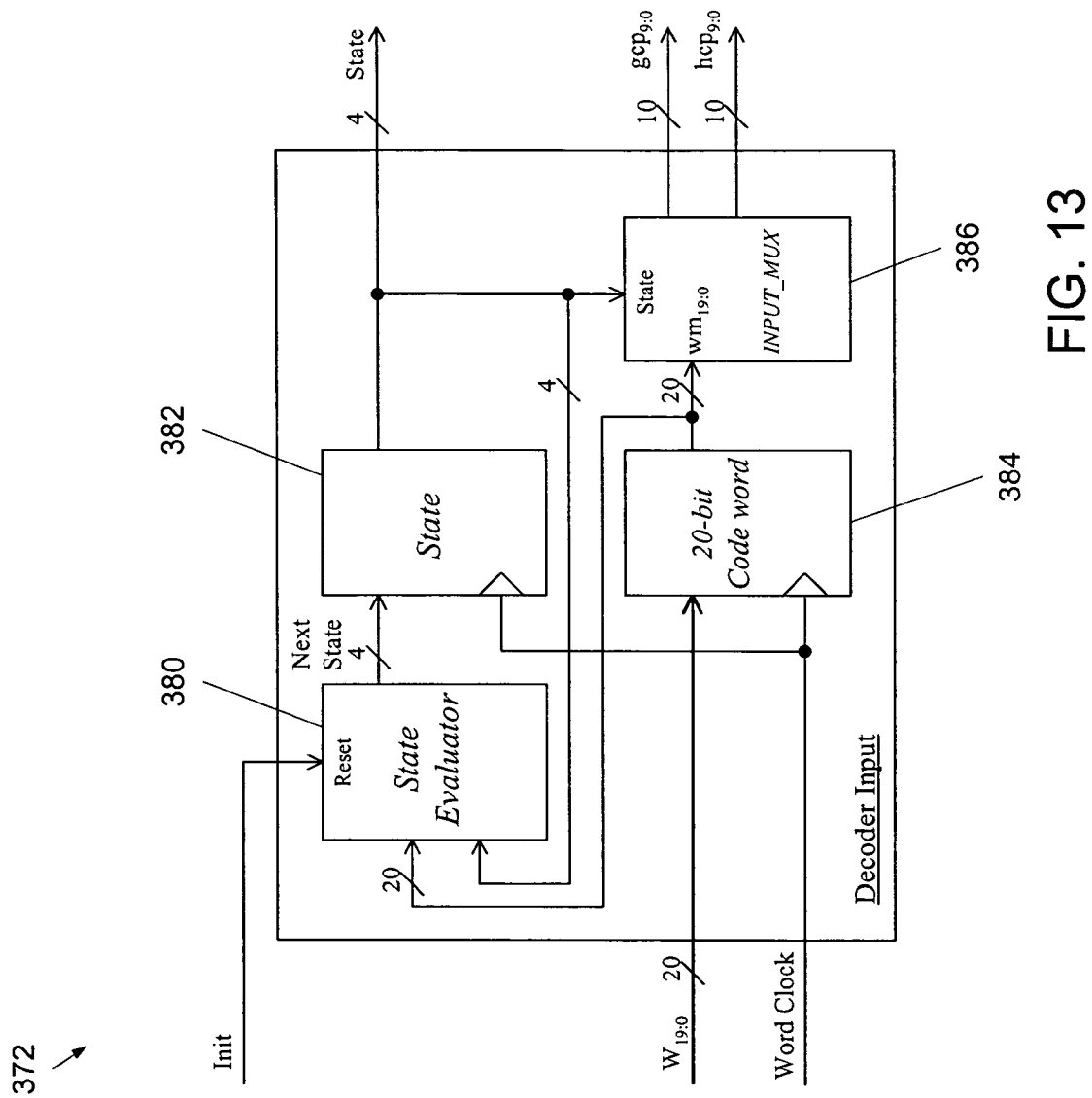
FIG. 13 is a block diagram of a decoder input circuit.

FIG. 13 illustrates a block diagram of decoder input circuit 372. Decoder input circuit 372 includes a state evaluator circuit 380, a state register 382, a 20-bit code word register 384 and an input mux 386. The initialization signal is sent to state evaluator circuit 380 and resets the state at the beginning of a first code word that is received from communication channel 252. The word clock initializes state register 382 and 20-bit code word register 384. The code word $W_{19:0}$ is sent to the 20-bit code word register 384. The 20-bit code word is sent to state evaluator circuit 380 and input mux 386. Input mux 386 separates the 20-bit code word into a 'g' segment gcp and an 'h' segment hcp. Decoder input circuit 372 operates according to the calculations in Table 15.

TABLE 15

Decoder Input

Input:  W(19:0), Init, Word Clock
Output: gcp(9:0), hcp(9:0), State(3:0)
The Init signal is used to initialize Next State(3:0) to zero before the first clock signal. The rising
edge of the Word Clock can be used to clock-in the 20-bit code word W(19:0) and shift the Next
State to the State register.
The State Evaluator is for calculating the Running Digital Sum (RDS) of the code word and the cumulative RDS. The RDS of the code word W(19:0) is:
    RDS = (2*HW)−20    where HW is the Hamming weight of W(19:0)
    Next State = State + RDS
Therefore, the State represents the cumulative RDS of all code bits up till the end of the last code
word.
INPUT MUX if( wm(19:0)==0x83EAA)   wm(19:0) = 0xAAAAAA;
if( wm(19:0)==0x43D55)      wm(19:0) = 0x55555;
if(State<=0)        {gcp(9:0)= wm(19:10);   hcp(9:0)= wm(9:0);    }
if(State>0)         {gcp(9:0)=!wm(19:10);   hcp(9:0)=!wm(9:0);    }
**************************************************************

Figure 14:
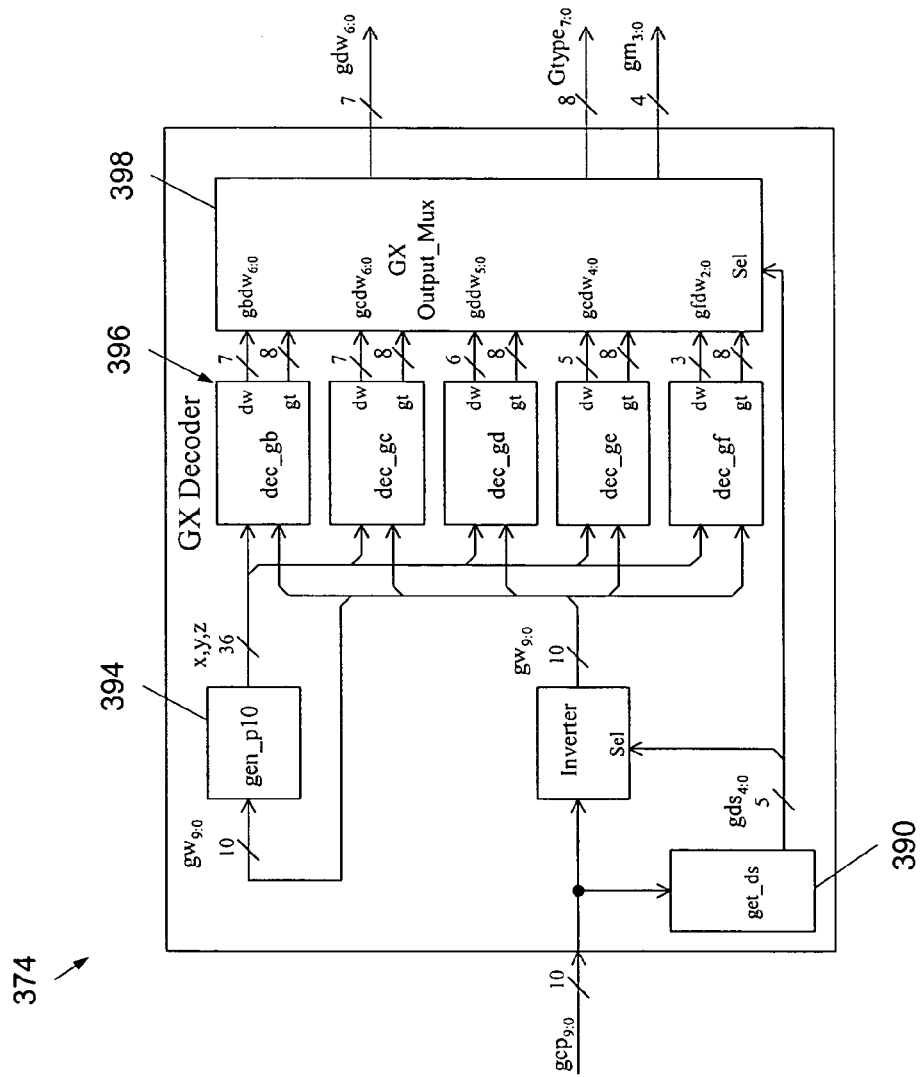
FIG. 14 is a block diagram of a decoder for decoding a first segment of a code word.

FIG. 14 illustrates a block diagram of GX decoder 374. GX decoder 374 receives 'g' segment gcp from decoder input circuit 372. GX decoder 374 includes digital sum circuit 390, inverter 392, pattern select 394, a plurality of 'g' subgroup decoders 396 and a GX output mux 398. Digital sum calculator 390 determines the digital sum of 'g' segment gcp. If the digital sum of the 'g' segment gcp is less than zero, the inverter 392 will invert the 'g' segment gcp. After passing through inverter 392, a 'g' word gw is sent to the pattern generator 394 and plurality of 'g' subgroup decoders 396. Pattern selector 394 determines a 36-bit pattern based on the 10-bit word. This 36-bit pattern is used in each of the plurality of subgroup decoders 396 in order to determine the appropriate data value for the 'g' group word. Each of the plurality of subgroup decoders send a value indicative of the subgroup to GX output mux 398. GX output 398 sends the appropriate 'g' word gdw and 'g' type to decoder output circuit 378. Additionally, a value gm indicative of the 'g' type is sent to HX decoder 376 in order to select the appropriate 'h' word. GX decoder 374 operates according to the calculations in Table 16.

Figure 15:
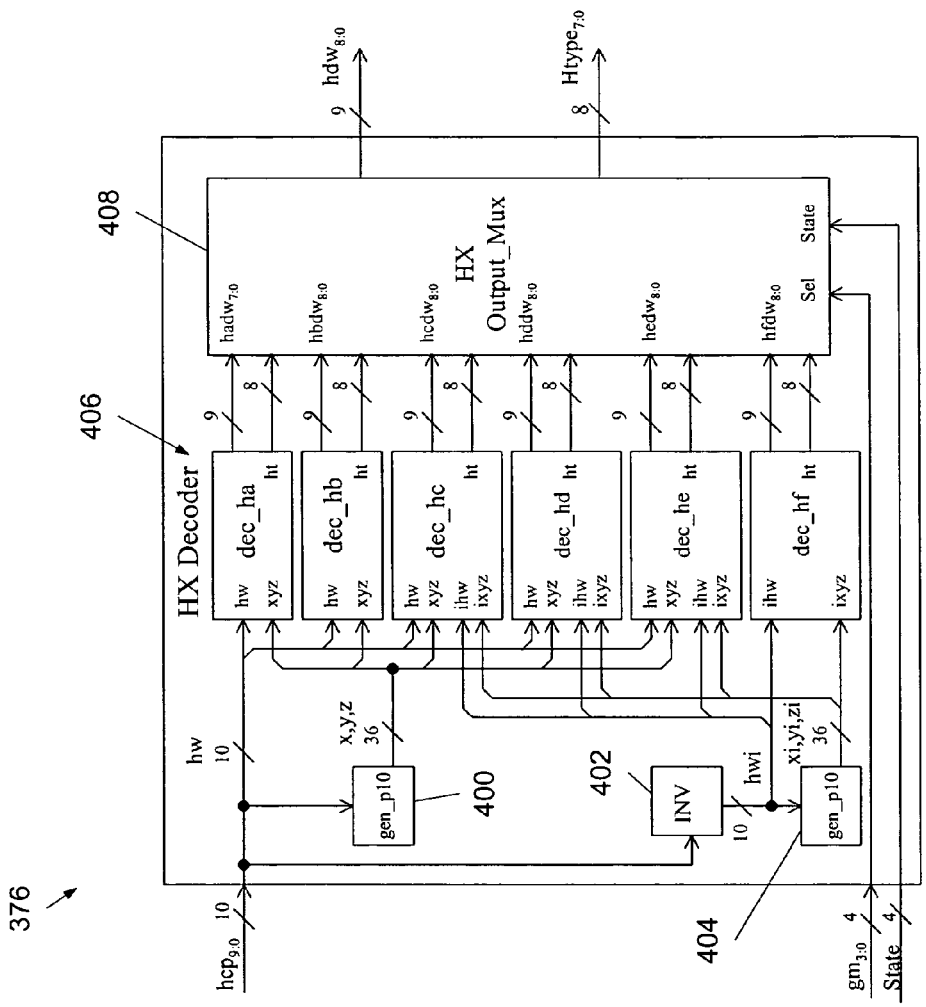
FIG. 15 is a block diagram of a decoder for decoding a second segment of a code word.

FIG. 15 illustrates a block diagram of HX decoder 376. HX decoder 376 includes a first pattern generator 400, an inverter 402, a second pattern generator 404, a plurality of subgroup decoders 406 and an HX output mux 408. The first pattern generator 400 generates a 36-bit pattern based on the 'h' word hcp. Second pattern generator 404 generates a 36-bit pattern based on the inverse of 'h' word hcp. These values are provided to the plurality of subgroup decoders 406. The plurality of subgroup decoders 406 determine the appropriate values to be sent to HX output mux 408. Based on the gm and state values, the appropriate 'h' word hdw and 'h' type are sent to decoder output circuit 378. HX decoder 374 operates according to the calculations in Table 17.

TABLE 17

HX Decoder

Input:   hcp(9:0), gm(3:0), State(3:0)
Output:  hdw(8:0), Htype(7:0)

TABLE 17-continued

INV

Input:   hcp(9:0)
Output:  hwi(9:0)
hwi(9:0) = !hcp(9:0)
gen_p10 is the same as that in GX Decoder.
dec_ha Input:   hw(9:0),x(3:0),y(15:0),z(15:0)
Output:  hadw(8:0), haht(7:0)
( dec_gc, dec_gd, dec_ge and get_ds ) are identical to those in GX_Decoder
Input Mux Input:  gcdw(6:0),gddw(6:0),gedw(6:0),gcgt(7:0),gdgt(7:0),gegt(7:0),
       hds(4:0)
Output: gdw(6:0), gt(7:0)
if(hds=2)    {gdw(6:0)=gcdw(6:0);     gt(7:0)=gcgt(7:0);    }
if(hds=4)    {gdw(6:0)=gddw(6:0);     gt(7:0)=gdgt(7:0);    }
if(hds=6)    {gdw(6:0)=gedw(6:0);     gt(7:0)=gegt(7:0);    }

TABLE 17-continued

Output_ha

```
Input:    gdw(6:0), gt(7:0)
Output:   hdw(8:0), ht(7:0)
if(gt=0x17)    {hdw(8:0)=gdw(6:0);              ht(7:0)=0x08;   }
if(gt=0x16)    {hdw(8:0)=gdw(6:0)|0x80;         ht(7:0)=0x08;   }
if(gt=0x26)    {hdw(8:0)=gdw(6:0)|0xC0;         ht(7:0)=0x08;   }
if(gt=0x25)    {hdw(8:0)=gdw(6:0);              ht(7:0)=0x06;   }
if(gt=0x35)    {hdw(8:0)=gdw(6:0)|0x20;         ht(7:0)=0x06;   }
if(gt=0x14)    {hdw(8:0)=gdw(6:0);              ht(7:0)=0x05;   }
if(gt=0x24)    {hdw(8:0)=gdw(6:0)|0x10;         ht(7:0)=0x05;   }
if(gt=0x23)    {hdw(8:0)=gdw(6:0);              ht(7:0)=0x04;   }
if(gt=0x33)    {hdw(8:0)=gdw(6:0)|0x08;         ht(7:0)=0x04;   }
Note: [hdw(8:0)=gdw(6:0)] means [hdw(8)=hdw(7)=0,
hdw(6:0)=gdw(6:0)]
``` dec_hb

```
Input:    hw(9:0),x(3:0),y(15:0),z(15:0)
Output:   hbdw(8:0), hbht(7:0)
( dec_gb, dec_gc, dec_gd, dec_ge, dec_gf and get_ds ) are identical to
those in GX_Decoder
Input Mux Input: gbdw(6:0), gcdw(6:0), gddw(6:0), gedw(6:0), gfdw(6:0),
       gbgt(7:0), gcgt(7:0), gdgt(7:0), gegt(7:0) gfgt(7:0), hds(4:0)
Output:  gdw(6:0), gt(7:0)
if(hds=0)    {gdw(6:0)=gbdw(6:0);        gt(7:0)=gbgt(7:0);    }
if(hds=2)    {gdw(6:0)=gcdw(6:0);        gt(7:0)=gcgt(7:0);    }
if(hds=4)    {gdw(6:0)=gddw(6:0);        gt(7:0)=gdgt(7:0);    }
if(hds=6)    {gdw(6:0)=gedw(6:0);        gt(7:0)=gegt(7:0);    }
if(hds=8)    {gdw(6:0)=gfdw(6:0);        gt(7:0)=gfgt(7:0);    }
```

Output_hb

```
Input:    gdw(6:0), gt(7:0)
Output:   hdw(8.0), ht(7:0)
if(gt=0x17)    {hdw(8:0)=gdw(6:0);              ht(7:0)=0x19;   }
if(gt=0x16)    {hdw(8:0)=gdw(6:0)|0x80;         ht(7:0)=0x19;   }
if(gt=0x26)    {hdw(8:0)=gdw(6:0)|0xC0;         ht(7:0)=0x19;   }
if(gt=0x07)    {hdw(8:0)=gdw(6:0)|0x100;        ht(7:0)=0x19;   }
if(gt=0x06)    {hdw(8:0)=gdw(6:0)|0x180;        ht(7:0)=0x19;   }
if(gt=0x05)    {hdw(8:0)=gdw(6:0)|0x1C0;        ht(7:0)=0x19;   }
if(gt=0x04)    {hdw(8:0)=gdw(6:0)|0x1E0;        ht(7:0)=0x19;   }
if(gt=0x03)    {hdw(8:0)=gdw(6:0)|0x1F0;        ht(7:0)=0x19;   }
if(gt=0x43)    {hdw(8:0)=gdw(6:0)|0x1F8;        ht(7:0)=0x19;   }
if(gt=0x25)    {hdw(8:0)=gdw(6:0);              ht(7:0)=0x16;   }
if(gt=0x35)    {hdw(8:0)=gdw(6:0)|0x20;         ht(7:0)=0x16;   }
if(gt=0x14)    {hdw(8:0)=gdw(6:0);              ht(7:0)=0x15;   }
if(gt=0x24)    {hdw(8:0)=gdw(6:0)|0x10;         ht(7:0)=0x15;   }
if(gt=0x23)    {hdw(8:0)=gdw(6:0);              ht(7:0)=0x14;   }
if(gt=0x33)    {hdw(8:0)=gdw(6:0)|0x08;         ht(7:0)=0x14;   }
Note: [hdw(8:0)=gdw(6:0)] means [hdw(8)=hdw(7)=0,
hdw(6:0)=gdw(6:0)]
``` dec_hc

```
Input: hw(9:0), x(3:0),y(15:0),z(15:0), ihw(9:0), ix(3:0),iy(15:0),iz(15:0)
Output: hcdw(8:0), hcht(7:0)
Note that the 36-bit input ixyz is the combination of ix(3:0), iy(15:0)
and iz(15:0).
( dec_gb, dec_gc, dec_gd, dec_ge and get_ds ) are identical to those in
GX_Decoder
Input Mux Input: igcdw(6:0), gbdw(6:0), gcdw(6:0), gddw(6:0), gedw(6:0),
       igcgt(7:0), gbgt(7:0), gcgt(7:0), gdgt(7:0), gegt(7:0), hds(4:0)
Output: gdw(6:0), gt(7:0)
if(hds=-2)   {gdw(6:0)=igcdw(6:0);       gt(7:0)=igcgt(7:0)|0x80;   }
if(hds=0)    {gdw(6:0)=gbdw(6:0);        gt(7:0)=gbgt(7:0);         }
if(hds=2)    {gdw(6:0)=gcdw(6:0);        gt(7:0)=gcgt(7:0);         }
if(hds=4)    {gdw(6:0)=gddw(6:0);        gt(7:0)=gdgt(7:0);         }
if(hds=6)    {gdw(6:0)=gedw(6:0);        gt(7:0)=gegt(7:0);         }
```

Output_hc

```
Input:    gdw(6:0), gt(7:0)
Output:   hdw(8:0), ht(7:0)
if(gt=0x17)    {hdw(8:0)=gdw(6:0);              ht(7:0)=0x29;   }
if(gt=0x16)    {hdw(8:0)=gdw(6:0)|0x80;         ht(7:0)=0x29;   }
if(gt=0x26)    {hdw(8:0)=gdw(6:0)|0xC0;         ht(7:0)=0x29;   }
if(gt=0x07)    {hdw(8:0)=gdw(6:0)|0x100;        ht(7:0)=0x29;   }
if(gt=0x06)    {hdw(8:0)=gdw(6:0)|0x180;        ht(7:0)=0x29;   }
if(gt=0x05)    {hdw(8:0)=gdw(6:0)|0x1C0;        ht(7:0)=0x29;   }
if(gt=0x04)    {hdw(8:0)=gdw(6:0)|0x1E0;        ht(7:0)=0x29;   }
if(gt=0x03)    {hdw(8:0)=gdw(6:0)|0x1F0;        ht(7:0)=0x29;   }
if(gt=0x02)    {hdw(8:0)=gdw(6:0)|0x1F8;        ht(7:0)=0x29;   }
if(gt=0x11)    {hdw(8:0)=gdw(6:0)|0x1FC;        ht(7:0)=0x29;   }
if(gt=0x91)    {hdw(8:0)=gdw(6:0)|0x1FE;        ht(7:0)=0x29;   }
if(gt=0x97)    {hdw(8:0)=gdw(6:0);              ht(7:0)=0x28;   }
if(gt=0x96)    {hdw(8:0)=gdw(6:0)|0x80;         ht(7:0)=0x28;   }
if(gt=0x25)    {hdw(8:0)=gdw(6:0)|0xC0;         ht(7:0)=0x28;   }
if(gt=0x35)    {hdw(8:0)=gdw(6:0)|0xE0;         ht(7:0)=0x28;   }
if(gt=0x14)    {hdw(8:0)=gdw(6:0);              ht(7:0)=0x26;   }
if(gt=0x24)    {hdw(8:0)=gdw(6:0)|0x10;         ht(7:0)=0x26;   }
if(gt=0x94)    {hdw(8:0)=gdw(6:0)|0x20;         ht(7:0)=0x26;   }
if(gt=0x23)    {hdw(8:0)=gdw(6:0)|0x30;         ht(7:0)=0x26;   }
if(gt=0x33)    {hdw(8:0)=gdw(6:0)|0x38;         ht(7:0)=0x26;   }
Note: [hdw(8:0)=gdw(6:0)] means [hdw(8)=hdw(7)=0,
hdw(6:0)=gdw(6:0)]
``` dec_hd

```
Input: hw(9:0), x(3:0),y(15:0),z(15:0), ihw(9:0), ix(3:0),iy(15:0),
       iz(15:0)
Output: hddw(8:0), hdht(7:0)
( dec_gb, dec_gc, dec_gd and get_ds ) are identical to those in
GX_Decoder
Output of the INV block is the bitwise inverse of its input.
Input Mux Input: igddw(6:0), igcdw(6:0), gbdw(6:0), gcdw(6:0), gddw(6:0),
       igdgt(7:0), igcgt(7:0), gbgt(7:0), gcgt(7:0), gdgt(7:0), hds(4:0)
Output: gdw(6:0), gt(7:0)
if(hds=-4)   {gdw(6:0)=igddw(6:0);       gt(7:0)=igdgt(7:0)|0x80;   }
if(hds=-2)   {gdw(6:0)=igcdw(6:0);       gt(7:0)=igcgt(7:0)|0x80;   }
if(hds=0)    {gdw(6:0)=gbdw(6:0);        gt(7:0)=gbgt(7:0);         }
if(hds=2)    {gdw(6:0)=gcdw(6:0);        gt(7:0)=gcgt(7:0);         }
if(hds=4)    {gdw(6:0)=gddw(6:0);        gt(7:0)=gdgt(7:0);         }
```

Output_hd

```
Input:    gdw(6:0), gt(7:0)
Output:   hdw(8:0), ht(7:0)
if(gt=0x17)    {hdw(8:0)=gdw(6:0);              ht(7:0)=0x39;   }
if(gt=0x16)    {hdw(8:0)=gdw(6:0)|0x80;         ht(7:0)=0x39;   }
if(gt=0x26)    {hdw(8:0)=gdw(6:0)|0xC0;         ht(7:0)=0x39;   }
if(gt=0x07)    {hdw(8:0)=gdw(6:0)|0x100;        ht(7:0)=0x39;   }
if(gt=0x06)    {hdw(8:0)=gdw(6:0)|0x180;        ht(7:0)=0x39;   }
if(gt=0x05)    {hdw(8:0)=gdw(6:0)|0x1C0;        ht(7:0)=0x39;   }
if(gt=0x04)    {hdw(8:0)=gdw(6:0)|0x1E0;        ht(7:0)=0x39;   }
if(gt=0x03)    {hdw(8:0)=gdw(6:0)|0x1F0;        ht(7:0)=0x39;   }
if(gt=0x02)    {hdw(8:0)=gdw(6:0)|0x1F8;        ht(7:0)=0x39;   }
if(gt=0x11)    {hdw(8:0)=gdw(6:0)|0x1FC;        ht(7:0)=0x39;   }
if(gt=0x91)    {hdw(8:0)=gdw(6:0)|0x1FE;        ht(7:0)=0x39;   }
if(gt=0x97)    {hdw(8:0)=gdw(6:0);              ht(7:0)=0x38;   }
if(gt=0x96)    {hdw(8:0)=gdw(6:0)|0x80;         ht(7:0)=0x38;   }
if(gt=0x25)    {hdw(8:0)=gdw(6:0)|0xC0;         ht(7:0)=0x38;   }
if(gt=0xA5)    {hdw(8:0)=gdw(6:0)|0xE0;         ht(7:0)=0x38;   }
if(gt=0xA6)    {hdw(8:0)=gdw(6:0);              ht(7:0)=0x37;   }
if(gt=0x14)    {hdw(8:0)=gdw(6:0)|0x40;         ht(7:0)=0x37;   }
if(gt=0x24)    {hdw(8:0)=gdw(6:0)|0x50;         ht(7:0)=0x37;   }
if(gt=0x94)    {hdw(8:0)=gdw(6:0)|0x60;         ht(7:0)=0x37;   }
if(gt=0x23)    {hdw(8:0)=gdw(6:0)|0x70;         ht(7:0)=0x37;   }
if(gt=0xA3)    {hdw(8:0)=gdw(6:0)|0x78;         ht(7:0)=0x37;   }
``` dec_he

```
Input: hw(9:0),x(3:0),y(15:0),z(15:0), ihw(9:0), ix(3:0),iy(15:0),
       iz(15:0)
Output: hedw(8:0), heht(7:0)
Description of Block dec_hc is shown before.
Since patterns of group "he" are the inverse of group "hc", dec_he is
same as dec_hc with the input inverted. Note here that input hw of
dec_he is used as input ihw of dec_hc and input ihw of dec_he is used
as
input hw of dec_hc. Similarly, xyz of dec_he is connected to ixyz of
dec_hc and vice versa.
hedw(8:0) = hdw(8:0) of dec_hc
Modify ht
heht(7:4) = [0,1,0,0]
heht(3:0) = ht(3:0) of ht from dec_hc
``` dec_hf

```
Input:    ihw(9:0), ix(3:0),iy(15:0),iz(15:0)
Output:   hfdw(8:0), hfht(7:0)
```

TABLE 17-continued

Description of Block dec_hb is shown before.
Since patterns of group "hf" are the inverse of group "hb", dec_hf is same as dec_hb with the input inverted. Note that input ihw of dec_hf is used as input hw of dec_hb. Similarly, ixyz of dec_hf is connected to xyz of dec_hb.
hfdw(8:0) = hdw(8:0) of dec_hb Modify ht hfht(7:4) = [0,1,0,1]
hfht(3:0) = ht(3:0) of ht from dec_hb HX Output Mux Input:   hadw(7:0), hbdw(8:0), hcdw(8:0), hddw(8:0), hedw(8:0),
         hfdw(8:0), haht(7:0), hbht(7:0), hcht(7:0), hdht(7:0), heht(7:0),
         hfht(7:0), gm(3:0), State(3:0)
Output:  hdw(8:0), Htype(7:0)
If(State< −4)    State=−4;
If(State> 4)     State= 4;
If(State=−4 or State= 4)
{   if(gm=9)    {hdw(8:0)=hadw(8:0);   Htype(7:0)=haht(7:0);   }
    if(gm=0)    {hdw(8:0)=hbdw(8:0);   Htype(7:0)=hbht(7:0);   }
    if(gm=1)    {hdw(8:0)=hcdw(8:0);   Htype(7:0)=hcht(7:0);   }
    if(gm=2)    {hdw(8:0)=hddw(8:0);   Htype(7:0)=hdht(7:0);   }
    if(gm=3)    {hdw(8:0)=hedw(8:0);   Htype(7:0)=heht(7:0);   }
}
If(State=−2 or State= 2)
{   if(gm=9)    {hdw(8:0)=hbdw(8:0);   Htype(7:0)=hbht(7:0);   }
    if(gm=0)    {hdw(8:0)=hcdw(8:0);   Htype(7:0)=hcht(7:0);   }
    if(gm=1)    {hdw(8:0)=hddw(8:0);   Htype(7:0)=hdht(7:0);   }
    if(gm=2)    {hdw(8:0)=hedw(8:0);   Htype(7:0)=heht(7:0);   }
    if(gm=3)    {hdw(8:0)=hfdw(8:0);   Htype(7:0)=hfht(7:0);   }
}
If(State= 0)
{   if(gm=9)    {hdw(8:0)=hcdw(8:0);   Htype(7:0)=hcht(7:0);   }
    if(gm=0)    {hdw(8:0)=hddw(8:0);   Htype(7:0)=hdht(7:0);   }
    if(gm=1)    {hdw(8:0)=hedw(8:0);   Htype(7:0)=heht(7:0);   }
    if(gm=2)    {hdw(8:0)=hfdw(8:0);   Htype(7:0)=hfht(7:0);   }
}

Figure 16:
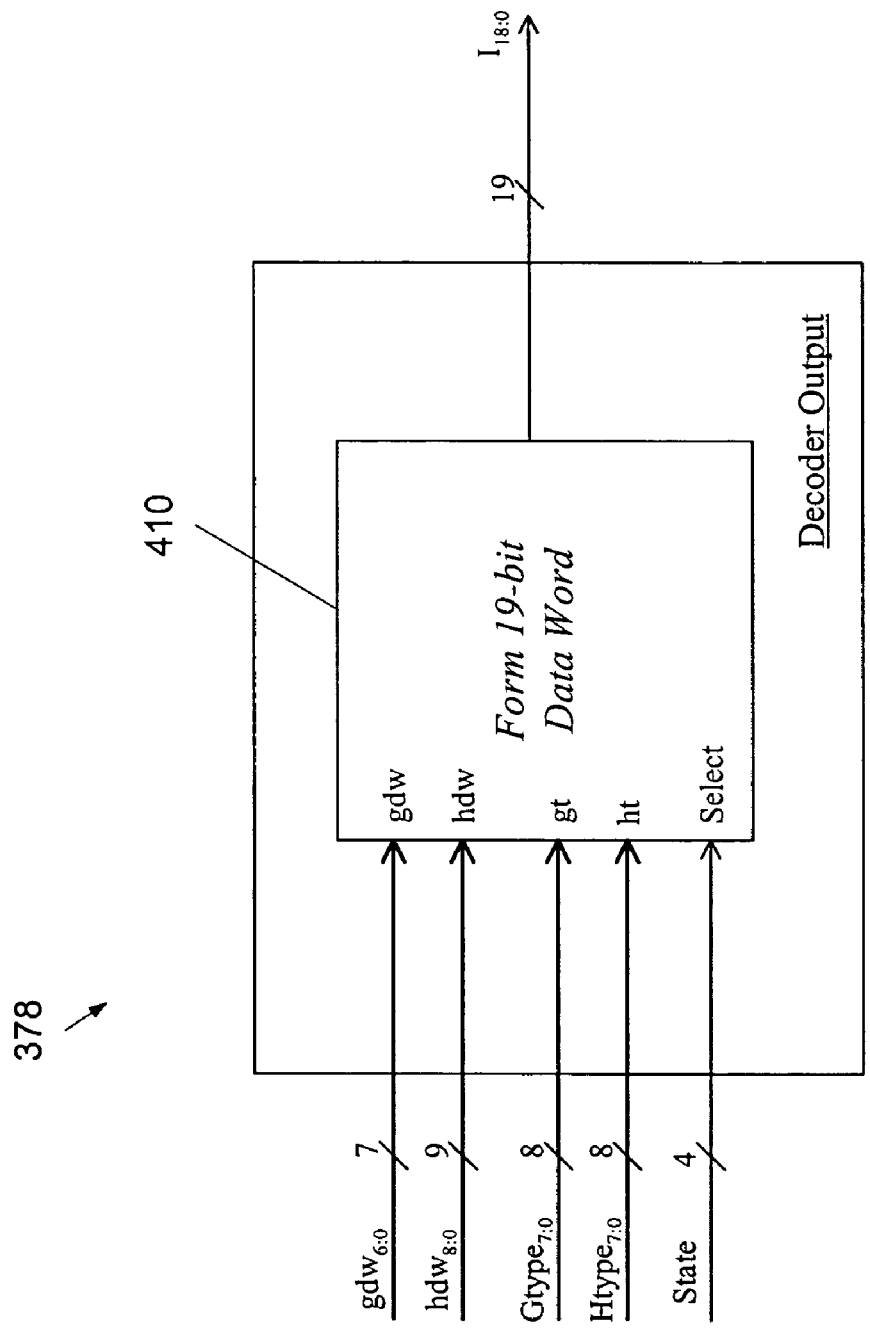
FIG. 16 is a block diagram of a decoder output circuit.

FIG. 16 illustrates a block diagram of decoder output circuit 378. Decoder output circuit 378 includes a form 19-bit data word circuit 410. The data word circuit 410 receives the 'g' word gdw, and 'h' word hdw, 'g' type, 'h' type and state. Using calculations, the data word circuit 410 outputs the user data word $I_{18:0}$. The operation of decoder output circuit 378 is performed according to the calculations in Table 18.

TABLE 18

Decoder Output

Input:   gdw(6:0), hdw(8:0), Gtype(7:0),Htype(7:0), State(3:0)
Output:  I(18:0)
if(State==−4 or 4)
{
    if( (gt==0x07)&&(ht==0x19) )    {I(18:16)=[0,0,0];
        I(15:9)=gdw(6:0);               I(8:0)=hdw(8:0); }
    if( (gt==0x17)&&(ht==0x29) )    {I(18:16)=[0,0,1];
        I(15:9)=gdw(6:0);               I(8:0)=hdw(8:0); }
    if( (gt==0x97)&&(ht==0x08) )    {I(18:15)=[0,1,0,0];
        I(14:8)=gdw(6:0);               I(7:0)=hdw(7:0); }
    if( (gt==0x06)&&(ht==0x19) )    {I(18:15)=[0,1,0,1];
        I(14:9)=gdw(5:0);               I(8:0)=hdw(8:0); }
    if( (gt==0x17)&&(ht==0x28) )    {I(18:15)=[0,1,1,0];
        I(14:8)=gdw(6:0);               I(7:0)=hdw(7:0); }
    if( (gt==0x16)&&(ht==0x29) )    {I(18:15)=[0,1,1,1];
        I(14:9)=gdw(5:0);               I(8:0)=hdw(8:0); }
    if( (gt==0x26)&&(ht==0x39) )    {I(18:15)=[1,0,0,0];
        I(14:9)=gdw(5:0);               I(8:0)=hdw(8:0); }
    if( (gt==0x96)&&(ht==0x08) )    {I(18:14)=[1,0,0,1,0];
        I(13:8)=gdw(5:0);               I(7:0)=hdw(7:0); }
    if( (gt==0x05)&&(ht==0x19) )    {I(18:14)=[1,0,0,1,1];
        I(13:9)=gdw(4:0);               I(8:0)=hdw(8:0); }
    if( (gt==0x16)&&(ht==0x28) )    {I(18:14)=[1,0,1,0,0];
        I(13:8)=gdw(5:0);               I(7:0)=hdw(7:0); }
    if( (gt==0x26)&&(ht==0x38) )    {I(18:14)=[1,0,1,0,1];
        I(13:8)=gdw(5:0);               I(7:0)=hdw(7:0); }
    if( (gt==0x25)&&(ht==0x39) )    {I(18:14)=[1,0,1,1,0];
        I(13:9)=gdw(4:0);               I(8:0)=hdw(8:0); }
    if( (gt==0x35)&&(ht==0x49) )    {I(18:14)=[1,0,1,1,1];
        I(13:9)=gdw(4:0);               I(8:0)=hdw(8:0); }
    if( (gt==0x97)&&(ht==0x06) )    {I(18:13)=[1,1,0,0,0,0];
        I(12:6)=gdw(6:0);               I(5:0)=hdw(5:0); }
    if( (gt==0x07)&&(ht==0x16) )    {I(18:13)=[1,1,0,0,0,1];
        I(12:6)=gdw(6:0);               I(5:0)=hdw(5:0); }
    if( (gt==0x04)&&(ht==0x19) )    {I(18:13)=[1,1,0,0,1,0];
        I(12:9)=gdw(3:0);               I(8:0)=hdw(8:0); }
    if( (gt==0x17)&&(ht==0x26) )    {I(18:13)=[1,1,0,0,1,1];
        I(12:6)=gdw(6:0);               I(5:0)=hdw(5:0); }
    if( (gt==0x14)&&(ht==0x29) )    {I(18:13)=[1,1,0,1,0,0];
        I(12:9)=gdw(3:0);               I(8:0)=hdw(8:0); }
    if( (gt==0x26)&&(ht==0x37) )    {I(18:13)=[1,1,0,1,0,1];
        I(12:7)=gdw(5:0);               I(6:0)=hdw(6:0); }
    if( (gt==0x25)&&(ht==0x38) )    {I(18:13)=[1,1,0,1,1,0];
        I(12:8)=gdw(4:0);               I(7:0)=hdw(7:0); }
    if( (gt==0x24)&&(ht==0x39) )    {I(18:13)=[1,1,0,1,1,1];
        I(12:9)=gdw(3:0);               I(8:0)=hdw(8:0); }
    if( (gt==0x35)&&(ht==0x48) )    {I(18:13)=[1,1,1,0,0,0];
        I(12:8)=gdw(4:0);               I(7:0)=hdw(7:0); }
    if( (gt==0x97)&&(ht==0x05) )    {I(18:12)=[1,1,1,0,0,0,1];
        I(11:5)=gdw(6:0);               I(4:0)=hdw(4:0); }
    if( (gt==0x96)&&(ht==0x06) )    {I(18:12)=[1,1,1,0,0,1,1];
        I(11:6)=gdw(5:0);               I(5:0)=hdw(5:0); }
    if( (gt==0x07)&&(ht==0x15) )    {I(18:12)=[1,1,1,0,1,0,0];
        I(11:5)=gdw(6:0);               I(4:0)=hdw(4:0); }
    if( (gt==0x06)&&(ht==0x16) )    {I(18:12)=[1,1,1,0,1,0,1];
        I(11:6)=gdw(5:0);               I(5:0)=hdw(5:0); }
    if( (gt==0x03)&&(ht==0x19) )    {I(18:12)=[1,1,1,0,1,1,0];
        I(11:9)=gdw(2:0);               I(8:0)=hdw(8:0); }
    if( (gt==0x16)&&(ht==0x26) )    {I(18:12)=[1,1,1,0,1,1,1];
        I(11:6)=gdw(5:0);               I(5:0)=hdw(5:0); }
    if( (gt==0x14)&&(ht==0x28) )    {I(18:12)=[1,1,1,1,0,0,0];
        I(11:8)=gdw(3:0);               I(5:0)=hdw(5:0); }
    if( (gt==0x25)&&(ht==0x37) )    {I(18:12)=[1,1,1,1,0,0,1];
        I(11:7)=gdw(4:0);               I(6:0)=hdw(6:0); }
    if( (gt==0x24)&&(ht==0x38) )    {I(18:12)=[1,1,1,1,0,1,0];
        I(11:8)=gdw(3:0);               I(7:0)=hdw(7:0); }
    if( (gt==0x23)&&(ht==0x39) )    {I(18:12)=[1,1,1,1,0,1,1];
        I(11:9)=gdw(2:0);               I(8:0)=hdw(8:0); }
    if( (gt==0x33)&&(ht==0x49) )    {I(18:12)=[1,1,1,1,1,0,0];
        I(11:9)=gdw(2:0);               I(8:0)=hdw(8:0); }
    if( (gt==0x97)&&(ht==0x04) )    {I(18:11)=[1,1,1,1,1,0,1,0];
        I(10:4)=gdw(6:0);               I(3:0)=hdw(3:0); }
    if( (gt==0x96)&&(ht==0x05) )    {I(18:11)=[1,1,1,1,1,0,1,1];
        I(10:5)=gdw(5:0);               I(4:0)=hdw(4:0); }
    if( (gt==0x07)&&(ht==0x14) )    {I(18:11)=[1,1,1,1,1,1,0,0];
        I(10:4)=gdw(6:0);               I(3:0)=hdw(3:0); }
    if( (gt==0x06)&&(ht==0x15) )    {I(18:11)=[1,1,1,1,1,1,0,1];
        I(10:5)=gdw(5:0);               I(4:0)=hdw(4:0); }
    if( (gt==0x05)&&(ht==0x16) )    {I(18:11)=[1,1,1,1,1,1,1,0];
        I(10:6)=gdw(5:0);               I(5:0)=hdw(5:0); }
    if( (gt==0x24)&&(ht==0x37) )    {I(18:11)=[1,1,1,1,1,1,1,1];
        I(10:7)=gdw(3:0);               I(6:0)=hdw(6:0); }
}
if(State==−2 or 2)
{
    if( (gt==0x97)&&(ht==0x19) )    {I(18:16)=[0,0,0];
        I(15:9)=gdw(6:0);               I(8:0)=hdw(8:0); }
    if( (gt==0x07)&&(ht==0x29) )    {I(18:16)=[0,0,1];
        I(15:9)=gdw(6:0);               I(8:0)=hdw(8:0); }
    if( (gt==0x17)&&(ht==0x39) )    {I(18:16)=[0,1,0];
        I(15:9)=gdw(6:0);               I(8:0)=hdw(8:0); }
    if( (gt==0x96)&&(ht==0x19) )    {I(18:15)=[0,1,1,0];
        I(14:9)=gdw(5:0);               I(8:0)=hdw(8:0); }
    if( (gt==0x07)&&(ht==0x28) )    {I(18:15)=[0,1,1,1];
        I(14:8)=gdw(6:0);               I(7:0)=hdw(7:0); }
    if( (gt==0x06)&&(ht==0x29) )    {I(18:15)=[1,0,0,0];
        I(14:9)=gdw(5:0);               I(8:0)=hdw(8:0); }
    if( (gt==0x17)&&(ht==0x38) )    {I(18:15)=[1,0,0,1];
        I(14:8)=gdw(6:0);               I(7:0)=hdw(7:0); }
    if( (gt==0x16)&&(ht==0x39) )    {I(18:15)=[1,0,1,0];
        I(14:9)=gdw(5:0);               I(8:0)=hdw(8:0); }
}

TABLE 18-continued

```
    if( (gt==0x26)&&(ht==0x49) )      {I(18:15)=[1,0,1,1];
        I(14:9)=gdw(5:0);              I(8:0)=hdw(8:0); }
    if( (gt==0x06)&&(ht==0x28) )      {I(18:14)=[1,1,0,0,0];
        I(13:8)=gdw(5:0);              I(7:0)=hdw(7:0); }
    if( (gt==0x05)&&(ht==0x29) )      {I(18:14)=[1,1,0,0,1];
        I(13:9)=gdw(4:0);              I(8:0)=hdw(8:0); }
    if( (gt==0x17)&&(ht==0x37) )      {I(18:14)=[1,1,0,1,0];
        I(13:7)=gdw(6:0);              I(6:0)=hdw(6:0); }
    if( (gt==0x16)&&(ht==0x38) )      {I(18:14)=[1,1,0,1,1];
        I(13:8)=gdw(5:0);              I(7:0)=hdw(7:0); }
    if( (gt==0x26)&&(ht==0x48) )      {I(18:14)=[1,1,1,0,0];
        I(13:8)=gdw(5:0);              I(7:0)=hdw(7:0); }
    if( (gt==0x35)&&(ht==0x59) )      {I(18:14)=[1,1,1,0,1];
        I(13:9)=gdw(4:0);              I(8:0)=hdw(8:0); }
    if( (gt==0x97)&&(ht==0x16) )      {I(18:13)=[1,1,1,1,0,0];
        I(12:6)=gdw(6:0);              I(5:0)=hdw(5:0); }
    if( (gt==0x07)&&(ht==0x26) )      {I(18:13)=[1,1,1,1,0,1];
        I(12:6)=gdw(6:0);              I(5:0)=hdw(5:0); }
    if( (gt==0x05)&&(ht==0x28) )      {I(18:13)=[1,1,1,1,1,0];
        I(12:8)=gdw(4:0);              I(7:0)=hdw(7:0); }
    if( (gt==0x04)&&(ht==0x29) )      {I(18:13)=[1,1,1,1,1,1];
        I(12:9)=gdw(3:0);              I(8:0)=hdw(8:0); }
}
if(State==0)
{
    if( (gt==0x97)&&(ht==0x29) )      {I(18:16)=[0,0,0];
        I(15:9)=gdw(6:0);              I(8:0)=hdw(8:0); }
    if( (gt==0x07)&&(ht==0x39) )      {I(18:16)=[0,0,1];
        I(15:9)=gdw(6:0);              I(8:0)=hdw(8:0); }
    if( (gt==0x17)&&(ht==0x49) )      {I(18:16)=[0,1,0];
        I(15:9)=gdw(6:0);              I(8:0)=hdw(8:0); }
    if( (gt==0x97)&&(ht==0x28) )      {I(18:15)=[0,1,1,0];
        I(14:8)=gdw(6:0);              I(7:0)=hdw(7:0); }
    if( (gt==0x96)&&(ht==0x29) )      {I(18:15)=[0,1,1,1];
        I(14:9)=gdw(5:0);              I(8:0)=hdw(8:0); }
    if( (gt==0x07)&&(ht==0x38) )      {I(18:15)=[1,0,0,0];
        I(14:8)=gdw(6:0);              I(7:0)=hdw(7:0); }
    if( (gt==0x06)&&(ht==0x39) )      {I(18:15)=[1,0,0,1];
        I(14:9)=gdw(5:0);              I(8:0)=hdw(8:0); }
    if( (gt==0x17)&&(ht==0x48) )      {I(18:15)=[1,0,1,0];
        I(14:8)=gdw(6:0);              I(7:0)=hdw(7:0); }
    if( (gt==0x16)&&(ht==0x49) )      {I(18:15)=[1,0,1,1];
        I(14:9)=gdw(5:0);              I(8:0)=hdw(8:0); }
    if( (gt==0x26)&&(ht==0x59) )      {I(18:15)=[1,1,0,0];
        I(14:9)=gdw(5:0);              I(8:0)=hdw(8:0); }
    if( (gt==0x96)&&(ht==0x28) )      {I(18:14)=[1,1,0,1,0];
        I(13:8)=gdw(5:0);              I(7:0)=hdw(7:0); }
    if( (gt==0x07)&&(ht==0x37) )      {I(18:14)=[1,1,0,1,1];
        I(13:7)=gdw(6:0);              I(6:0)=hdw(6:0); }
    if( (gt==0x06)&&(ht==0x38) )      {I(18:14)=[1,1,1,0,0];
        I(13:8)=gdw(5:0);              I(7:0)=hdw(7:0); }
    if( (gt==0x05)&&(ht==0x39) )      {I(18:14)=[1,1,1,0,1];
        I(13:9)=gdw(4:0);              I(8:0)=hdw(8:0); }
    if( (gt==0x16)&&(ht==0x48) )      {I(18:14)=[1,1,1,1,0];
        I(13:8)=gdw(5:0);              I(7:0)=hdw(7:0); }
    if( (gt==0x25)&&(ht==0x59) )      {I(18:14)=[1,1,1,1,1];
        I(13:9)=gdw(4:0);              I(8:0)=hdw(8:0); }
}
```

In summary, a method (200) of encoding digital information in a system is provided. The method (200) includes receiving (202) a sequence of user bits and calculating (204) a running digital sum (RDS) of the system. In addition, a code word is generated (214) based on the sequence of user bits and the RDS of the system to maintain the RDS of the system calculated with the code word to within a selected range.

Another embodiment of the present invention relates to a system (100, 250) for generating a code word from a sequence of user bits. The system (100, 250) has an input circuit (254) adapted to receive the sequence of user bits and a calculation circuit (332) adapted to calculate the running digital sum (RDS) of the system. An encoder (250) is also provide that is adapted to generate a code word based on the sequence of user bits and the RDS of the system to maintain the RDS of the system calculated with the code word to within a selected range.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the communication system while maintaining substantially the same functionality without departing from the scope and spirit of the present invention. In addition, although the preferred embodiment described herein is directed to a coding system for a disc drive, it will be appreciated by those skilled in the art that the teachings of the present invention can be applied to system such as satellite communications and cellular phones, without departing from the scope and spirit of the present invention.

What is claimed is:

1. A codeword representing an encoded user data word for use in a communication channel, comprising:
    a first segment representing a first fragment of the user data word and comprising a plurality of bits having a running digital sum (RDS); and
    a second segment representing a second fragment of the user data word and comprising a plurality of bits based on the RDS of the first segment, wherein the first fragment and the second fragment have a different number of bits.

2. The codeword of claim 1 wherein the communication channel is in a system having a running digital sum (RDS) based on previous bits in the system and wherein the codeword has a bit pattern representing the user data word and the RDS of the system.

3. The codeword of claim 1 wherein the first fragment and the second fragment have a number of bits based on a running digital sum (RDS) of the channel that is associated with the encoded user data word.

4. The codeword of claim 1 wherein the user data word is 19 bits.

5. The codeword of claim 1 wherein the first segment and the second segment are based on a third fragment of the user data word.

6. The codeword of claim 1 wherein the first segment is 10 bits and the second segment is 10 bits.

7. A codeword representing an encoded user data word for use in a system, the codeword comprising:
    a first segment representing a first fragment of the user data word; and
    a second segment representing a second fragment of the user data word, wherein the first and second segments together combine to represent a state value for the system that is associated with the encoded user data word.

8. The codeword of claim 7 wherein the second segment has a bit pattern based on a running digital sum of the first segment.

9. The codeword of claim 7 wherein the first segment is 10 bits and the second segment is 10 bits.

10. The codeword of claim 9 wherein the encoded user data word is 19 bits.

11. The codeword of claim 7 wherein the first fragment and the second fragment have a number of bits based on the state value of the system.

12. The codeword of claim 7 wherein the first fragment has a different number of bits than the second fragment.

13. The codeword of claim 7 wherein the user data word includes a third fragment, wherein the first fragment and the second fragment are based on the third fragment.

14. A codeword representing an encoded user data word for use in a system, the codeword comprising:
- a first segment representing a first fragment of the user data word; and
- a second segment representing a second fragment of the user data word, wherein the first and second segments represent a state value for the system that is associated with the user data word and the first and second fragments are based on a third fragment of the user data word.

15. The codeword of claim 14 wherein the first fragment and the second fragment have a different number of bits.

16. The codeword of claim 14 wherein the first fragment, the second fragment and the third fragment have a number of bits based on the state value of the system.

17. The codeword of claim 14 wherein the second segment has a bit pattern based on a running digital sum of the first segment.

18. The codeword of claim 14 wherein the first segment is 10 bits and the second segment is 10 bits.

19. The codeword of claim 18 wherein the encoded user data word is 19 bits.

* * * * *